(12) United States Patent
Myung et al.

(10) Patent No.: US 11,128,313 B2
(45) Date of Patent: Sep. 21, 2021

(54) APPARATUS AND METHOD FOR DECODING SIGNAL IN WIRELESS COMMUNICATION SYSTEM

(71) Applicants: Samsung Electronics Co., Ltd., Suwon-si (KR); Seoul National University R&DB Foundation, Seoul (KR)

(72) Inventors: Seho Myung, Seoul (KR); Jae-Won Kim, Seoul (KR); Jong-Seon No, Seoul (KR); Pilwoong Yang, Seoul (KR); Jun-Woo Tak, Seoul (KR)

(73) Assignees: Samsung Electronics Co., Ltd., Suwon-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/637,691

(22) PCT Filed: Aug. 3, 2018

(86) PCT No.: PCT/KR2018/008830
§ 371 (c)(1),
(2) Date: Feb. 7, 2020

(87) PCT Pub. No.: WO2019/031769
PCT Pub. Date: Feb. 14, 2019

(65) Prior Publication Data
US 2020/0382133 A1    Dec. 3, 2020

(30) Foreign Application Priority Data

Aug. 8, 2017  (KR) .................. 10-2017-0100342

(51) Int. Cl.
*H03M 13/09*  (2006.01)
*H03M 13/25*  (2006.01)
(Continued)

(52) U.S. Cl.
CPC ......... *H03M 13/09* (2013.01); *H03M 13/256* (2013.01); *H03M 13/413* (2013.01); *H04L 1/0061* (2013.01)

(58) Field of Classification Search
CPC ..................................................... H03M 13/09
(Continued)

(56) References Cited

U.S. PATENT DOCUMENTS

| | | | |
|---|---|---|---|
| 8,230,308 B2 * | 7/2012 | Takanashi | H03M 13/413 714/792 |
| 2009/0172503 A1 | 7/2009 | Takanashi | |

(Continued)

FOREIGN PATENT DOCUMENTS

| | | |
|---|---|---|
| KR | 10-2009-0071455 A | 7/2009 |
| KR | 10-2017-0014339 A | 2/2017 |

OTHER PUBLICATIONS

ISA/KR, International Search Report and Written Opinion of the International Searching Authority, International Application No. PCT/KR2018/008830, dated Nov. 2, 2018, 11 pages.

*Primary Examiner* — Fritz Alphonse

(57) ABSTRACT

The present disclosure relates to a pre-$5^{th}$-Generation (5G) or 5G communication system to be provided for supporting higher data rates Beyond $4^{th}$-Generation (4G) communication system such as Long Term Evolution (LTE). A method of decoding a signal in a communication system includes receiving an encoded bit-stream corresponding to message bits and first Cyclic Redundancy Check (CRC) bits, obtaining a codeword through a traceback for at least part of the encoded bit-stream, generating second CRC bits by performing CRC encoding on the codeword, and performing decoding based on at least part of the second CRC bits.

18 Claims, 26 Drawing Sheets

(51) Int. Cl.
*H03M 13/41* (2006.01)
*H04L 1/00* (2006.01)

(58) Field of Classification Search
USPC .......................................................... 714/807
See application file for complete search history.

(56) References Cited

U.S. PATENT DOCUMENTS

| | | |
|---|---|---|
| 2009/0238311 A1 | 9/2009 | Schmidl et al. |
| 2010/0034325 A1* | 2/2010 | Abdallah .......... H03M 13/4169 375/341 |
| 2012/0036416 A1 | 2/2012 | Wang et al. |
| 2013/0111305 A1 | 5/2013 | Wang et al. |
| 2013/0124947 A1* | 5/2013 | Lane ................. H03M 13/4176 714/786 |
| 2016/0112157 A1* | 4/2016 | Li ........................ H04L 1/0061 714/807 |
| 2017/0033807 A1 | 2/2017 | Kim et al. |
| 2019/0306838 A1* | 10/2019 | Hui ...................... H04L 1/0057 |

* cited by examiner

APPARATUS AND METHOD FOR DECODING SIGNAL IN WIRELESS COMMUNICATION SYSTEM

CROSS-REFERENCE TO RELATED APPLICATIONS

This application is a 371 National Stage of International Application No. PCT/KR2018/008830, filed Aug. 3, 2018, which claims priority to Korean Patent Application No. 10-2017-0100342, filed Aug. 8, 2017, the disclosures of which are herein incorporated by reference in their entirety.

BACKGROUND

1. Field

The present disclosure relates in general to a communication system, and in particular, to an apparatus and method for decoding a signal in the communication system.

2. Description of Related Art

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

Since high-speed and high-capacity communication systems are required in various wired/wireless systems including the 5G system, a channel encoding scheme for increasing transmission efficiency is becoming important. However, a wireless channel environment causes a data error due to various reasons such as multi-path interference, fading, noise, signal attenuation, or the like. Therefore, there is ongoing discussion on many techniques for detecting errors occurring in a transmission process and for correct data decoding.

SUMMARY

On the basis of the aforementioned discussion, the present disclosure provides an apparatus and method for effectively decoding a signal in a communication system.

In addition, the present disclosure provides an apparatus and method for decreasing an amount of computation for Viterbi decoding in a communication system.

In addition, the present disclosure provides an apparatus and method for Viterbi decoding using a Cyclic Redundancy Check (CRC) bit in a communication system.

In addition, the present disclosure provides an apparatus and method for selecting a candidate group of an initial state for list Viterbi decoding by using a CRC bit in a communication system.

In addition, the present disclosure provides an apparatus and method for fixing a progress path on a trellis diagram by using a CRC bit in a communication system.

Solution to Problem

According to various embodiments of the present disclosure, a method of decoding a signal in a communication system includes receiving an encoded bit-stream corresponding to message bits and first CRC bits, obtaining a codeword through a traceback for at least part of the encoded bit-stream, obtaining second CRC bits by performing CRC encoding on the codeword, and performing decoding based on at least part of the second CRC bits.

According to various embodiments of the present disclosure, an apparatus for decoding a signal in a communication system may include a transceiver, and at least one processor operatively coupled to the transceiver. The at least one processor may receive an encoded bit-stream corresponding to message bits and first CRC bits, obtain a codeword through a traceback for at least part of the encoded bit-stream, obtain second CRC bits by performing CRC encoding on the codeword, and perform decoding based on at least part of the second CRC bits.

Advantageous Effects of Invention

An apparatus and method according to various embodiments of the present disclosure can decrease computation complexity and improve performance in such a manner that a candidate group of an initial state is estimated by using a Cyclic Redundancy Check (CRC) bit and a progress path is fixed on a trellis diagram when list Viterbi decoding is performed.

Advantageous effects that can be obtained in the present disclosure are not limited to the aforementioned advantageous effects, and other unmentioned advantageous effects can be clearly understood by one of ordinary skill in the art to which the present invention pertains from the description below.

DETAILED DESCRIPTION

Terms used in the present disclosure are for the purpose of describing particular embodiments only and are not intended to limit other embodiments. A singular expression may include a plural expression unless there is a contextually distinctive difference. Unless otherwise defined, all terms (including technical and scientific terms) used herein have the same meaning as commonly understood by those ordinarily skilled in the art disclosed in the present disclosure. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the present disclosure should not be interpreted to exclude the embodiments of the present disclosure.

A hardware-based approach is described for example in the various embodiments of the present disclosure described hereinafter. However, since the various embodiments of the present disclosure include a technique in which hardware and software are both used, a software-based approach is not excluded in the embodiments of the present disclosure.

Hereinafter, the present disclosure relates to an apparatus and method for decoding a signal in a communication system. Specifically, the present disclosure describes a technique of decoding a signal by using a Cyclic Redundancy Check (CRC) bit in Viterbi decoding.

Terms used hereinafter to refer to a signal, an encoding and decoding scheme, an information unit, a constitutional element of a device, and the like are exemplified for convenience of explanation. Therefore, the present disclosure is not limited to the terms described below, and thus other terms having the same technical meaning may also be used.

Although the present disclosure also describes various embodiments by using terms used in some communication standards (e.g., 3$^{rd}$ Generation Partnership Project (3GPP)), this is for exemplary purposes only. Various embodiments of the present disclosure may be easily modified, and thus may also be applied to other communication systems.

Figure 1:
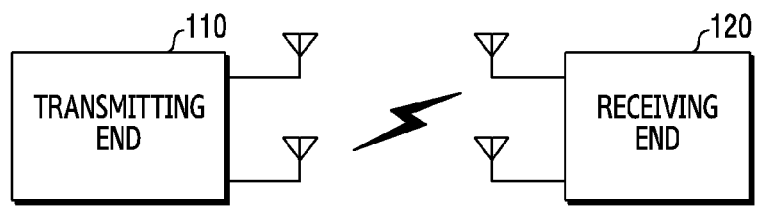
FIG. 1 illustrates a communication system according to various embodiments of the present disclosure.

FIG. 1 illustrates a communication system according to various embodiments of the present disclosure. A transmitting end 110 and a receiving end 120 are exemplified in FIG. 1 as part of nodes which use a wireless channel in the communication system.

Although one transmitting end 110 and one receiving end 120 are illustrated in FIG. 1, a plurality of transmitting ends which are the same as or different from the transmitting end 110 and a plurality of receiving ends which are the same as or different from the receiving end 120 may be further included. Although the transmitting end 110 and the receiving end 120 are described as separate independent entities in the present disclosure for convenience of explanation, the transmitting end 110 and the receiving end 120 may mutually change functions to be performed. For example, in an uplink case of a cellular communication system, the transmitting end 110 may be a terminal, and the receiving end 120 may be a base station. For another example, in a downlink case, the transmitting end 110 may be a base station, and the receiving end 120 may be a terminal.

Herein, the base station may be referred to as an 'Access Point (AP)', an 'eNodeB (eNB)', a '5$^{th}$ Generation (5G) node', a 'wireless point', a 'Transmission/Reception Point (TRP)', or other terms having equivalent technical meanings. In addition, the terminal may be referred to as a 'User Equipment (UE)', a 'mobile station', a 'subscriber station', a 'remote terminal', a 'wireless terminal', a 'user device', or other terms having equivalent technical meanings.

Optionally, the transmitting end 110 or the receiving end 120 may be operated without user involvement. That is, as a device for performing Machine Type Communication (MTC), the transmitting end 110 or the receiving end 120 may not be carried by a user. If the transmitting end 110 or the receiving end 120 is the device for performing the MTC, a Tail Biting Convolutional Coding (TBCC) encoding scheme and a Viterbi decoding scheme may be considered to minimize power consumption of the device.

The transmitting end 110 may transmit a signal to the receiving end 120. The receiving end 120 may receive the signal from the transmitting end 110, and may decode the received signal. For example, the transmitting end 110 may transmit the signal to the receiving end 120 by using the TBCC encoding scheme. The receiving end 120 may receive the signal from the transmitting end 110, and may decode the signal by using the Viterbi decoding scheme. According to an embodiment, the transmitting end 110 transmits the signal by decoding an input through the TBCC encoding scheme, and the receiving end 120 decodes the signal by using the Viterbi decoding scheme. In this case, the receiving end 120 needs to perform Viterbi decoding for all initial states to decode the input without error, which has a demerit in that computation complexity is significantly great. Accordingly, a method may be considered in which an initial state candidate group is created by estimating an initial state for performing the Viterbi decoding in a proper range, and the Viterbi decoding is performed only for the candidate group.

For example, decoding using a List Viterbi Algorithm (LVA) may be considered in the system of FIG. 1. The Viterbi algorithm is a type of a non-linear reception scheme, and is based on a Maximum Likelihood (ML) scheme. In the ML scheme, an input having a minimum Euclidean distance is selected by substituting all symbols that can be transmitted through all transmission antennas, thereby improving performance. Therefore, in general, although Viterbi decoding must be performed for all possible initial states to achieve ML performance, there is a problem of high computation complexity and power consumption. Therefore, there is a need for a process of properly estimating a candidate group of an initial state. Therefore, in the LVA, the candidate groups of the initial state are estimated, and a codeword candidate group having a good metric is selected by performing Viterbi decoding on each candidate of the initial state. In case of list Viterbi decoding, a CRC bit is used to identify whether a candidate codeword is a correct codeword among candidate groups of a final codeword. However, since to-be-estimated candidate groups of the initial state are determined generally based on a metric value simply through a Viterbi algorithm, there are many cases where the codeword is incorrect in practice. Further, in case of a failure in CRC checking, the Viterbi algorithm for obtaining the final codeword must be repeatedly performed.

Figure 2:
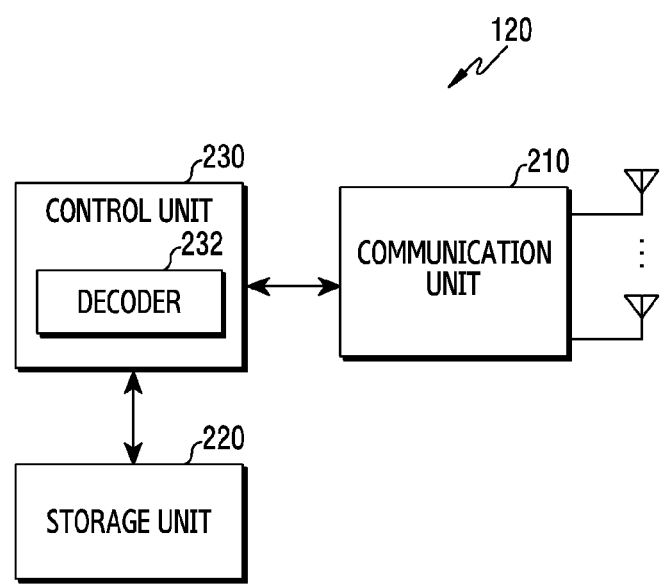
FIG. 2 illustrates a structure of a receiving end in a communication system according to various embodiments of the present disclosure.

FIG. 2 illustrates a structure of a receiving end in a communication system according to various embodiments of the present disclosure. The structure exemplified in FIG. 2 may be understood as a structure of the receiving end 120. Hereinafter, the term ' . . . unit', ' . . . device', or the like implies a unit of processing at least one function or operation, and may be implemented in hardware or software or in combination of the hardware and the software Referring to FIG. 2, the receiving end includes a communication unit 210, a storage unit 220, and a control unit 230.

The communication unit 210 performs functions for transmitting/receiving a signal through a wireless channel. For example, the communication unit 210 may perform a function of conversion between a baseband signal and a bit-stream according to a physical layer standard of a system. For example, in data transmission, the communication unit 210 generates complex symbols by coding and modulating a transmission bit-stream. In addition, in data reception, the communication unit 210 restores a received bit-stream by demodulating and decoding a baseband signal. In addition, the communication unit 210 up-converts a baseband signal into a Radio Frequency (RF) signal and thereafter transmits it through an antenna, and down-converts an RF signal received through the antenna into a baseband signal. For example, the communication unit 210 may include a transmission filter, a reception filter, an amplifier, a mixer, an oscillator, a Digital to Analog Converter (DAC), an Analog to Digital Converter (ADC), or the like.

In addition, the communication unit 210 may include a plurality of transmission/reception paths. Further, the communication unit 210 may include at least one antenna array constructed of a plurality of antenna elements. From a hardware aspect, the communication unit 210 may be constructed of a digital circuit and an analog circuit (e.g., a Radio Frequency Integrated Circuit (RFIC)). Herein, the digital circuit and the analog circuit may be implemented as one package. In addition, the communication unit 210 may include a plurality of RF chains. Further, the communication unit 210 may perform beamforming.

As described above, the communication unit 210 transmits and receives a signal. Accordingly, the communication unit 210 may be referred to as a transmitter, a receiver, or a transceiver. In addition, in the following description, transmission and reception performed through a wireless channel are used to imply that the aforementioned processing is performed by the communication unit 210. According to various embodiments, the communication unit 201 comprises one or more transceiver units.

The storage unit 220 stores data such as a basic program, application program, configuration information, or the like for an operation of the receiving end. The storage unit 220 may be constructed of a volatile memory, a non-volatile memory, or a combination of the volatile memory and the non-volatile memory. In addition, the storage unit 220 provides stored data at the request of the control unit 230. According to an embodiment, the storage unit 220 may be integrated with at least one memory for storing data required to perform Viterbi decoding. In this case, the storage unit 220 provides data pre-stored in the storage unit 220 at the request of a decoder 232. According to an embodiment, the storage unit 220 may provide the decoder 232 with data for a survivor path based on a traceback of the decoder 232.

The control unit 230 controls overall operations of the receiving end. For example, the control unit 230 transmits and receives a signal via the communication unit 210. Further, the control unit 230 writes data to the storage unit 220, and reads the data. In addition, the control unit 230 may perform functions of a protocol stack required in a communication standard. For this, the control unit 340 may include at least one processor or micro-processor, or may be part of the processor. Further, the part of the communication unit 210 and the control unit 230 may be called a Communication Processor (CP).

According to various embodiments, the control unit 230 may include the decoder 232. The decoder 232 is a device for receiving a bit-stream encoded in the receiving end and transmitted through a transmission antenna and for converting it into an input bit-stream before being subjected to encoding. Therefore, the decoder 232 may be a device for decoding a signal in association with encoding applied in the transmitting end. For example, when the input bit-stream is transmitted through TBCC encoding in the transmitting end, the decoder 232 which performs decoding in association with the TBCC-encoded bit-stream may be a Viterbi decoder.

Herein, as an instruction set or code stored in the storage unit 220, the decoder 232 may be an instruction/code temporarily resided in the control unit 230 or a storage space in which the instruction/code is stored, or may be part of a circuitry which constitutes the control unit 230.

According to various embodiments, the control unit 230 may perform Viterbi decoding via the decoder 232. In this case, the control unit 230 may use a CRC bit. For example, the control unit 230 may control the receiving end to perform operations according to various embodiments described below. According to an embodiment, the control unit 230 may use a CRC bit to select candidate groups of a proper initial state for an LVA via the decoder 232. According to another embodiment, the control unit 230 may perform Viterbi decoding for a properly estimated candidate group of an initial state. When performing Viterbi decoding for the candidate group of the initial state, the control unit 230 may fix a progress path on a trellis diagram, and may use a CRC bit to compute a metric value.

Figure 3:
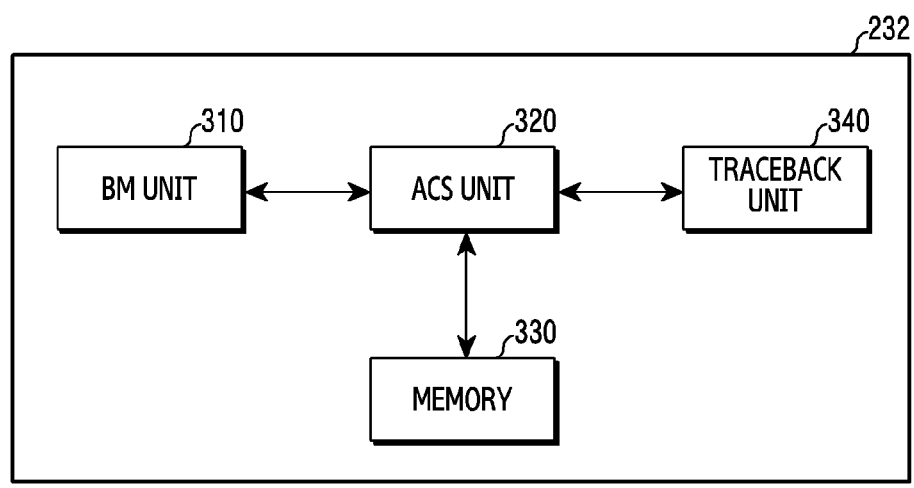
FIG. 3 illustrates a structure of a decoder in a communication system according to various embodiments of the present disclosure.

FIG. 3 illustrates a structure of a decoder in a communication system according to various embodiments of the present disclosure. It may be understood that the structure of FIG. 3 is part of the structure of the decoder 232.

Referring to FIG. 3, the decoder may include a Branch Metric (BM) unit 310, an Add Compare Select (ACS) unit 320, a memory 330, and a traceback unit 340.

The BM unit 310 computes a metric value for each branch in a trellis diagram by using a received bit-stream. Herein, the branch implies a path for proceeding to a next state from a current state. For example, an input bit has a value of 0 or 1, and thus the number of paths for proceeding to the next state from the current state, that is, the number of branches, may be 2. However, this is only an example of a Viterbi operation based on hard decision using a hamming distance, and the present disclosure is not limited thereto. For another example, in case of a Viterbi operation based on soft decision using a Euclidean distance, the number of branches for proceeding to the next state from the current state may be greater than 2.

Specifically, the BM unit 310 computes a metric value by comparing a bit-stream received in the current state and a bit-stream output from the branch. For example, if a constraint length k of a convolution encoder is 3, the number of shift registers of the convolution encoder is 2, and thus one branch outputs a bit-stream consisting of 2 bits. Herein, a metric implies a numeric number or parameter which is used as a criterion for comparison. Although the hamming distance is used for the metric, the present disclosure is not limited thereto.

According to an embodiment, in case of soft decision based Viterbi decoding which has a constraint length of 3 and uses a hamming distance as a metric, a branch matric value that can be output is any one of 0 (both of two bits of a received bit-stream and an output bit-stream are matched), 1 (one of bits of the received bit-stream and the output bit-stream is matched), and 2 (both of two bits of the received bit-stream and the output bit-stream are mismatched). According to another embodiment, in case of hard decision based Viterbi decoding which uses a Euclidean distance as a metric, a branch metric which can be output may not be an integer.

The ACS unit 320 may perform Add, Compare, and Select operations to select a path having a minimum matric value among paths reaching the current state. The ACS unit 320 performs the Add operation to add a metric value of a branch for reaching the current state from a previous state, to a state metric value of the previous state. That is, the ACS unit 320 generates state metric values for reaching the current state from each branch through the Add operation. For example, the hard decision based Viterbi operation may have state metric values for two paths, i.e., a path reaching the current state with an input bit of 0 and a path reaching the current state with an input bit of 1. Thereafter, the ACS unit 320 performs the Compare operation by outputting a value obtained from a result of performing subtraction upon receiving the state metric values for reaching the current state at each branch. The ACS unit 320 performs the Select operation by selecting and outputting a smaller value among possible state metric values of the current state. That is, the ACS unit 320 selects a path having a small state metric value, which means a selection for a path for outputting a bit-stream most similar to the received bit-stream. Although it is illustrated herein that a path corresponding to a small state metric value is selected when the metric is the hamming distance, the present disclosure is not limited thereto. For example, when another metric is used, a path corresponding to a great state metric value may be selected.

The memory 330 stores information on a survivor path. Specifically, the survivor path implies a path selected through the Compare operation of the ACS unit 320, and a path which does not have a comparison target is maintained as the survivor path. The memory 330 stores information on survivor paths selected in a process of transitioning from an initial state to a final state. Thereafter, the memory 330 provides the traceback unit 340 with information on the survivor path of each state.

The traceback unit 340 performs back-tracing from the final state to the initial state on the basis of the trellis diagram configured through the Viterbi operation in the ACS unit 320. Herein, the back-tracing may be referred to as other terms having the same meaning, such as a 'traceback' or the like. That is, the traceback unit 340 performs the traceback in a state having a lowest state metric value among final states of the trellis diagram, and decodes an input bit-stream along a Maximum Likelihood (ML) path, that is, a path having a highest possibility of occurrence. The traceback unit 340 may output a codeword including bits corresponding to the survivor path stored in the memory 330 in the traceback process. Herein, the output codeword implies a result of decoding an input bit-stream, that is, a decoded bit-stream. For example, if the survivor path corresponds to a path which has proceeded to a next state upon receiving an input of 0 in a previous state, the traceback unit 340 may obtain the input of 0 as an output based on the traceback. That is, the traceback unit 340 generates a codeword which is a bit-stream as a decoding result, by obtaining bits corresponding to the survivor path on the trellis path sequentially from the final state to initial state of the ML path. Although it is described that the codeword according to the present disclosure refers to a decoded bit-stream as a result of decoding the input bit-stream, the present disclosure is not limited thereto. According to another embodiment, the codeword may refer to an input bit-stream. In this case, a result of decoding the input bit-stream may be referred to as an information word.

Due to a characteristic of a TBCC encoder which has last (K−1) bits as an initial state of an encoder, a Viterbi algorithm starts at any initial state of the trellis diagram and ends at the same final state. If the initial state and the final state are identical, there is a high possibility that an error has successfully been corrected, and if the states are not identical, there is a high possibility that the error correction has failed. In addition, considering the aforementioned characteristic of the TBCC encoder, the trellis diagram for the TBCC-encoded bit-stream may have a cylindrical structure. Therefore, the receiving end may configure the trellis diagram irrespective of order of the encoded bit-stream. For example, the receiving end may configure the trellis diagram starting at a CRC bit.

At least part of embodiments described below uses a trellis diagram having a modified form that can be configured based on a circular structure described above.

Figure 4:
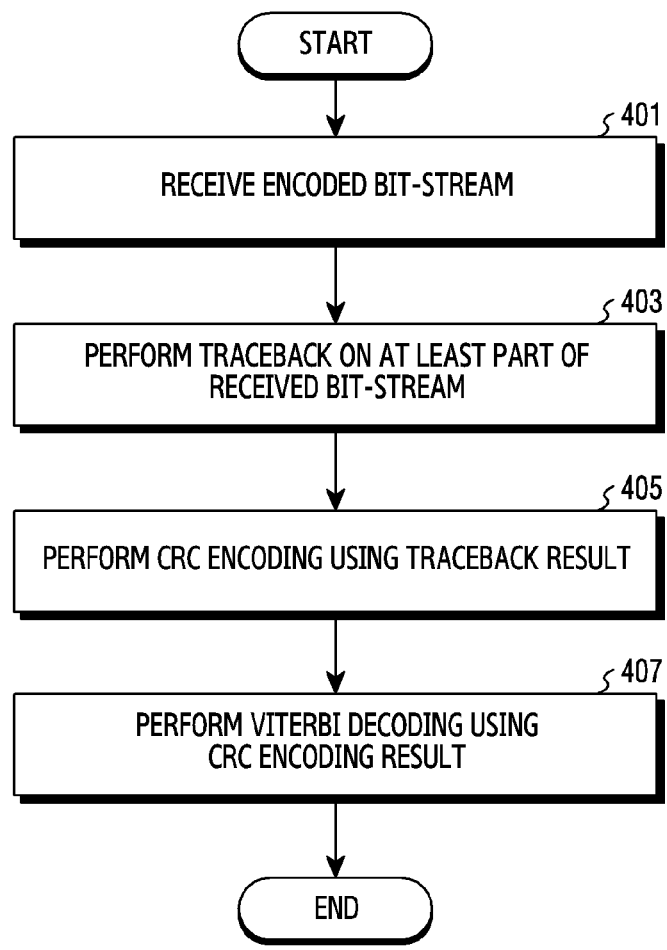
FIG. 4 illustrates a flowchart of a receiving end for decoding a signal in a communication system according to various embodiments of the present disclosure.

FIG. 4 illustrates a flowchart of a receiving end for decoding a signal in a communication system according to various embodiments of the present disclosure. A method of operating the receiving end 120 is exemplified in FIG. 4.

Referring to FIG. 4, in step 401, the receiving end receives an encoded bit-stream. That is, the receiving end receives the encoded bit-stream from a transmitting end through a radio channel. According to an embodiment, the encoded bit-stream may be a bit-stream encoded based on concatenated encoding which uses CRC encoding for an outer code and uses TBCC encoding based on a code rate and constraint length determined in a transmitting end for an inner code. Thereafter, the bit-stream subjected to concatenated encoding may be transmitted based on a final code rate. In this case, a finally encoded bit-stream may be determined based on a circular buffer. For example, if a code rate based on the bit-stream subjected to CRC and TBCC concatenated encoding is not matched to the final code rate, the transmitting end transmits a bit-stream matched to the final code rate to the receiving end by performing puncturing on the encoded bit-stream or by adding a parity bit.

In step 403, the receiving end performs a traceback on at least part of the received bit-stream. According to an embodiment, the receiving end may perform the traceback on the at least part of the bit-stream without having to perform the traceback on all of the received bit-streams. For example, the receiving end may configure a modified trellis diagram which starts at a CRC bit, and may perform the traceback only on a trellis path for a message bit. For another example, the receiving end may configure the trellis diagram which starts at the message bit, and may start the traceback at a final state for the message bit without having to proceed to the trellis path for the CRC bit.

In step 405, the receiving end 120 performs CRC encoding using a traceback result. Hereinafter, for convenience of explanation, a CRC bit for an input bit-stream of the transmitting end is referred to as a first CRC bit, and a CRC bit for a codeword obtained through the traceback is referred to as a second CRC bit. That is, the receiving end may obtain a codeword for message bits through the traceback and perform CRC encoding on the obtained codeword to obtain (or generate) the second CRC bits. The aforementioned CRC encoding is the same encoding as CRC encoding performed on an input bit-stream in the transmitting end. Even if the same codeword as the message bits of the input bit-stream is output in the transmitting end, the first CRC bit and the second CRC bit may not be matched when a different CRC encoding scheme is used for the codeword.

In step 407, the receiving end 120 performs Viterbi decoding using a CRC encoding result. That is, the receiving end may use a second CRC bit obtained by performing CRC encoding on a codeword to perform Viterbi decoding for a received bit-stream. According to an embodiment, the receiving end may output codewords for passing through a correct trellis path by selecting a candidate group of an initial state on the basis of the second CRC bit. For example, the receiving end may determine whether the second CRC bit is matched to the initial state of the trellis path. According to another embodiment, the receiving end may proceed to a fixed path on the trellis diagram on the basis of the second CRC bit, and may perform an LVA in which computation complexity is decreased by computing a metric value.

Figure 5:
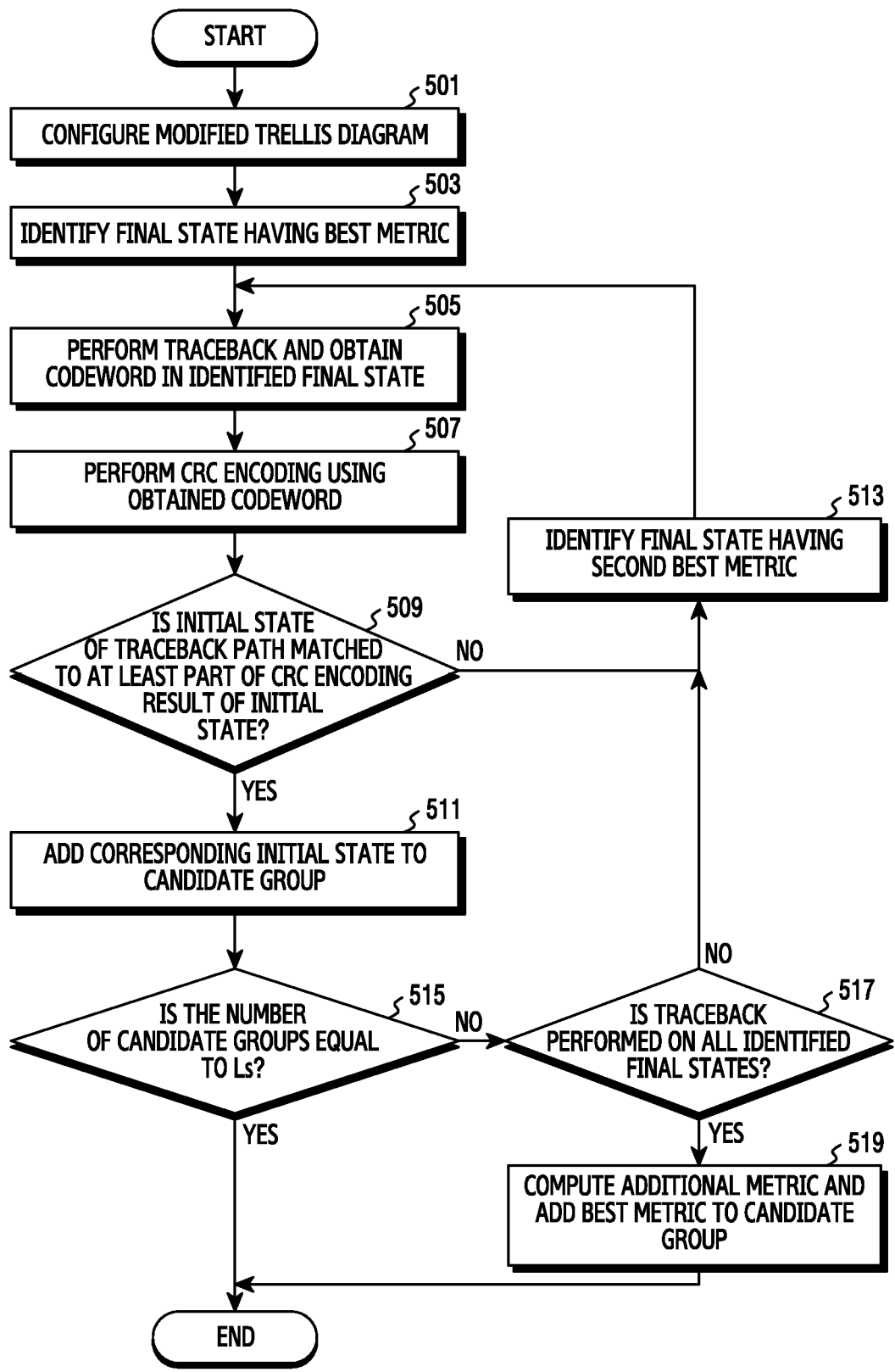
FIG. 5 illustrates a flowchart of a receiving end for estimating a candidate group of an initial state by using a Cyclic Redundancy Check (CRC) bit and for performing Viterbi decoding in a communication system according to various embodiments of the present disclosure.

FIG. 5 illustrates a flowchart of a receiving end for estimating a candidate group of an initial state by using a CRC bit and for performing Viterbi decoding in a communication system according to various embodiments of the present disclosure. A method of operating the receiving end 120 is exemplified in FIG. 5.

Referring to FIG. 5, in step 501, a receiving end configures a modified trellis diagram. That is, the receiving end may receive a bit-stream encoded and transmitted in a transmitting end, and may configure the trellis diagram on the basis thereof. Herein, the configuring of the trellis diagram may include computing of a metric value through the received bit-stream. According to an embodiment, the modified trellis diagram is a trellis diagram which proceeds from a CRC bit to a message bit, in that order.

In step 503, the receiving end identifies a final state having a best metric. Herein, the best metric implies a metric value having a final state with a highest probability of occurrence among a plurality of final states when computing a metric for the received bit-stream. For example, in case of using a hamming distance as a metric, a final state having a lowest metric among a plurality of final states may be identified. On the other hand, in case of using another type of a metric, a final state having a greatest metric among the plurality of final states may be identified.

In step 505, the receiving end performs a traceback in the identified state to obtain a codeword. That is, the receiving end performs the traceback in the final state having the best metric to obtain a codeword consisting of outputs of bits corresponding to a survivor path. According to an embodiment, the receiving end may perform the traceback, starting from the final state for the message bit until an initial state for the message bit. Herein, since the trellis diagram is a trellis with a modified order, the initial state for the message bit has the same state as a final state for a CRC bit. Therefore, since the receiving end performs a trackback only until the final state of the CRC bit, a codeword for the message bit is obtained through a traceback for the message bit, without having to perform the traceback on a trellis path corresponding to the CRC bit.

In step 507, the receiving end performs CRC encoding using the obtained codeword. That is, the receiving end obtains a codeword for the message bit through the traceback, and obtains a CRC bit by performing CRC encoding on the codeword. Herein, it should be noted that a first CRC bit and a second CRC bit are not necessarily matched.

In step 509, the receiving end determines whether the initial state of the traceback path is matched to at least part of a CRC encoding result. That is, the receiving end determines whether a state reached when the traceback is performed up to the initial state for the message bit is constructed of bits of an end portion of the second CRC bit. Herein, at least part of targets subjected to determining of whether the matching is made is the number of bits constituting one state, and may correspond to a constraint length of the convolution encoder or the number of shift registers. According to an embodiment, a convolution encoder having a constraint length of 7 has 6 shift registers, and an initial state of the convolution encoder in the transmitting end is configured with a combination of 6 bits. The convolution encoder is affected by a current state according to a previous input corresponding to a shift register length, and due to such a characteristic, an initial state for a message bit on a modified trellis diagram is determined depending on only last 6 bits among CRC bits. However, the present disclosure is not limited thereto, and if the convolution encoder has a different constraint length, the number of bits for determining the initial state for the message bit may vary.

In step 511, the receiving end adds the initial state to the candidate group. That is, if it is determined that the initial state of the traceback path is matched to at least part of the CRC encoding result, since there is a high possibility that a codeword obtained from the traceback path conforms to a correct trellis path, the receiving end adds the initial state of the traceback path to the candidate group for the initial state.

In step 513, the receiving end identifies the final state having a second best metric. That is, if the initial state of the traceback path for the best metric is not matched to the at least part of the CRC encoding result, the receiving end repeats the performing of the traceback on the final state having the second best metric. According to an embodiment, in case of the convolution encoder having the constraint length of 7, if last 6 bits of the CRC bit based on CRC encoding are not matched to the initial state of the traceback path, a codeword corresponding to the path is a codeword which has a best metric but passes through an incorrect trellis path, and thus an initial state of the path is not added to the initial state candidate group. This is because there is a high possibility of being mismatched in CRC checking even if an LVA is additionally performed. Therefore, the receiving end performs the traceback from a final state having a second best metric, and repeats a process of determining whether the initial state of the traceback path is matched to at least part of the CRC encoding result.

In step 515, the receiving end determines whether the number of candidate groups is equal to Ls. That is, in order to determine whether it satisfies the number of initial states for performing the LVA, the receiving end compares whether the number of initial states included in the candidate group is equal to Ls. If the number of initial states included in the candidate group is equal to Ls, since all candidate groups of an initial state suitable for performing the LVA are found, the receiving end may end a process of estimating the initial state candidate group using a CRC bit. Otherwise, if the number of initial states included in the candidate group is not Ls, the receiving end may perform step 517.

In step 517, the receiving end determines whether the traceback has been performed on all of the identified final states. Considering that the LVA operates at a low Signal to Noise Ratio (SNR), even if the receiving end performs the traceback on all final states of the modified trellis diagram and determines whether being matched to at least part of bits, the number of estimated candidate groups of the initial state may not be Ls. Therefore, the receiving end may determine whether the traceback is performed on all final states, and if there is a state in which the traceback has not yet been performed, proceeding to step 513, may repeat the process of finding the candidate group of the initial state. Otherwise, if the traceback is performed on all final states, the receiving end may proceed to step 519.

In step 519, the receiving end computes an additional metric, and adds a state having a best metric to an initial state candidate group. That is, in case of being based on a metric value computed previously, the receiving end may determine that the initial state candidate group can no longer be added, and may additionally compute a metric for a CRC bit of the same received bit-stream. According to an embodiment, the receiving end may additionally configure a modified trellis diagram for the received bit-stream. If the metric is repeatedly computed for the same received bit-stream, the receiving end may continuously configure the modified trellis diagram in consideration of having a metric value close to a bit-stream in practice. For example, states having the same metric value in the final state of a first trellis diagram may have a different metric value in a final state of a second trellis diagram, and a state having a lowest metric value among the final states of the second trellis diagram may be a final state of a correct trellis path in practice. Therefore, the receiving end may compute an additional metric, and may add a state having a best metric value among new final states to the initial state candidate group. According to an embodiment, in order to complete Ls candidate groups, the receiving end may add a plurality of final states to the candidate group in order of metrics in a new final state based on the additional metric.

Table 1 below shows a probability that a correct initial state is selected according to the aforementioned initial state estimation scheme.

TABLE 1

| Message bit length = 48, code rate = 1/6 | | Message bit length = 120, code rate = 1/6 | |
| --- | --- | --- | --- |
| SNR | P(A) | SNR | P(A) |
| −5 | 0.342405 | −5 | 0.458308 |
| −4 | 0.618344 | −4 | 0.73849 |
| −3 | 0.872193 | −3 | 0.929733 |
| −2 | 0.974051 | −2 | 0.989675 |
| −1 | 0.997223 | −1 | 0.999224 |

In Table 1 above, cases where message bits have different sizes are compared at the same code rate. It can be seen that the greater the SNR, the higher the accuracy of initial state estimation using a CRC bit. Referring to Table 1, it can be seen that the greater the size of the message bit in the same SNR, the higher the probability of correctly estimating the initial state. This is because, when the size of the message bit is great, the number of times of performing a Viterbi algorithm is greater than a case where the size of the message bit is small, and thus there is a high possibility of having a best metric value in a final state of the message bit.

Figure 6A:
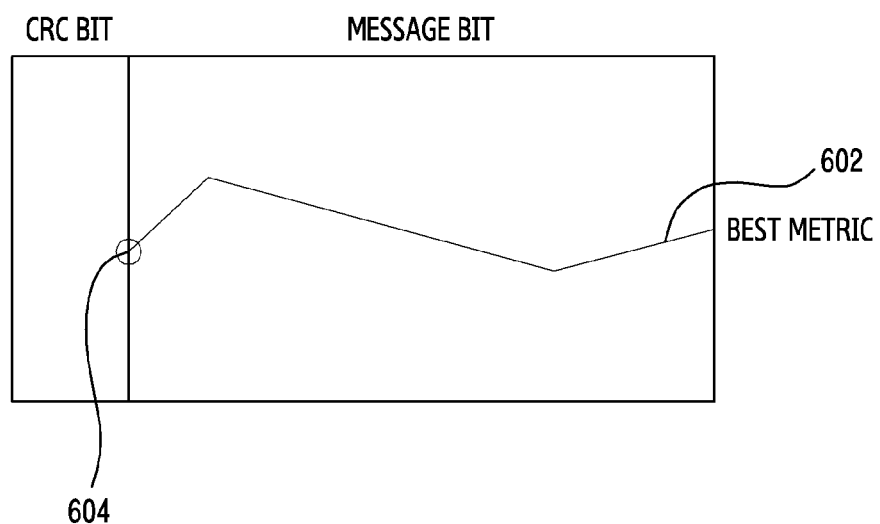
FIG. 6A and FIG. 6B illustrate a trellis diagram for initial state estimation using a CRC bit in a communication system according to various embodiments of the present disclosure.
Figure 6B:
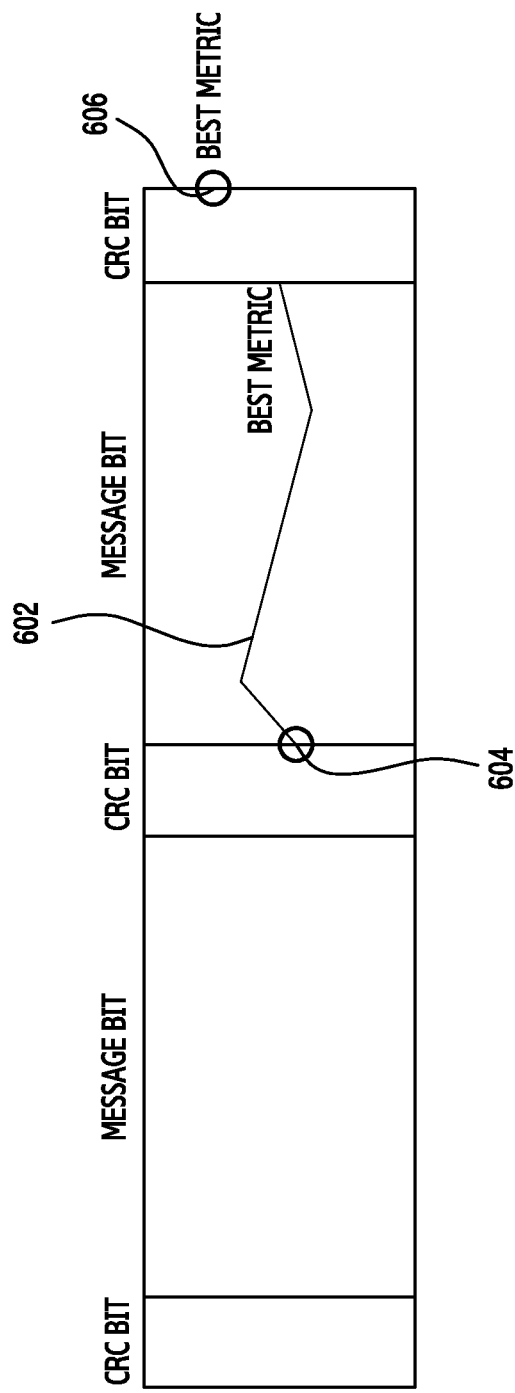

FIG. 6A and FIG. 6B illustrate a trellis diagram for initial state estimation using a CRC bit in a communication system according to various embodiments of the present disclosure.

Referring to FIG. 6A, a trellis diagram is shown in which a starting point of a Viterbi operation is modified. According to an embodiment, the receiving end first performs a Viterbi algorithm for a CRC bit instead of performing the Viterbi algorithm in order of the CRC bit after a message bit. Therefore, metrics are computed in an orderly manner from the CRC bit on a trellis diagram, and survivor paths are determined in each state and then are stored in a memory.

A path 602 indicates a trellis path having a best metric value. That is, the path 620 is a result of computing a metric value of up to a message bit on a trellis diagram and performing a traceback in a state of having a best metric value among final states. That is, the path 602 represents one codeword, as a set of survivor paths having a maximum likelihood.

A state 604 indicates a final state for CRC 16 bits. That is, the state 604 implies a state reached when a trellis path proceeds for the CRC 16 bits. For the CRC 16 bits, initial 10 bits do not have effect on a position of the state 604. For example, in case of a convolution encoder having a constraint length of K=7, one state is determined according to 6 bits. However, since a current state is determined by a combination of six bits as a previous input, a final state of a trellis diagram for the CRC bit is determined according to last six bits. In addition, since an order of the CRC bit and the message bit has been changed, a final bit for the CRC bit corresponds to an initial state for the message bit. Therefore, the receiving end may identify whether last 6 bits of a second CRC bit is matched to the state 604, and thus may add the state to the initial state candidate group.

FIG. 6B illustrates a modified trellis diagram starting at a CRC bit. Referring to FIG. 6B, a receiving end repeatedly configures the modified trellis diagram. Hereinafter, for convenience of explanation, a first diagram is referred to as a first trellis diagram, and a second diagram is referred to as a second trellis diagram. The receiving end repeatedly computes metrics for all received bits two times until the second trellis diagram is configured. The receiving end selects an initial state candidate group according to a metric value in a final state of the second trellis diagram. Specifically, the receiving end performs a traceback in a final state corresponding to a best metric value among final states of the second trellis diagram, and obtains a second CRC bit by performing CRC encoding on an obtained codeword. The receiving end determines whether last 6 bits of a second CRC bit are matched to the state 604. Thereafter, if the state 604 is matched to the last 6 bits of the obtained second CRC bit, the receiving end adds the state 604 to a candidate group of an initial state. The receiving end repeats the aforementioned process until the number of the initial state candidate groups is equal to Ls. That is, the receiving end adds the state 604 to the initial state candidate group, and performs the traceback from a state of having a second best metric value among final states of the second trellis diagram. If the number of candidate groups of the initial state is Ls, the receiving end may end the procedure without having to add the initial state candidate group any more. According to an embodiment, if the number of initial state candidate groups is less than Ls, the receiving end configures an additional trellis diagram for CRC 16 bits and computes an accumulated metric value. Thereafter, the receiving end may add at least one final state to the initial state candidate group in order of best metrics among final states having the accumulated metric value. For example, the receiving end may additionally configure a trellis diagram for the CRC 16 bits, and may add a state 606 having a best metric among a plurality of final states as the initial state candidate group.

Figure 7:
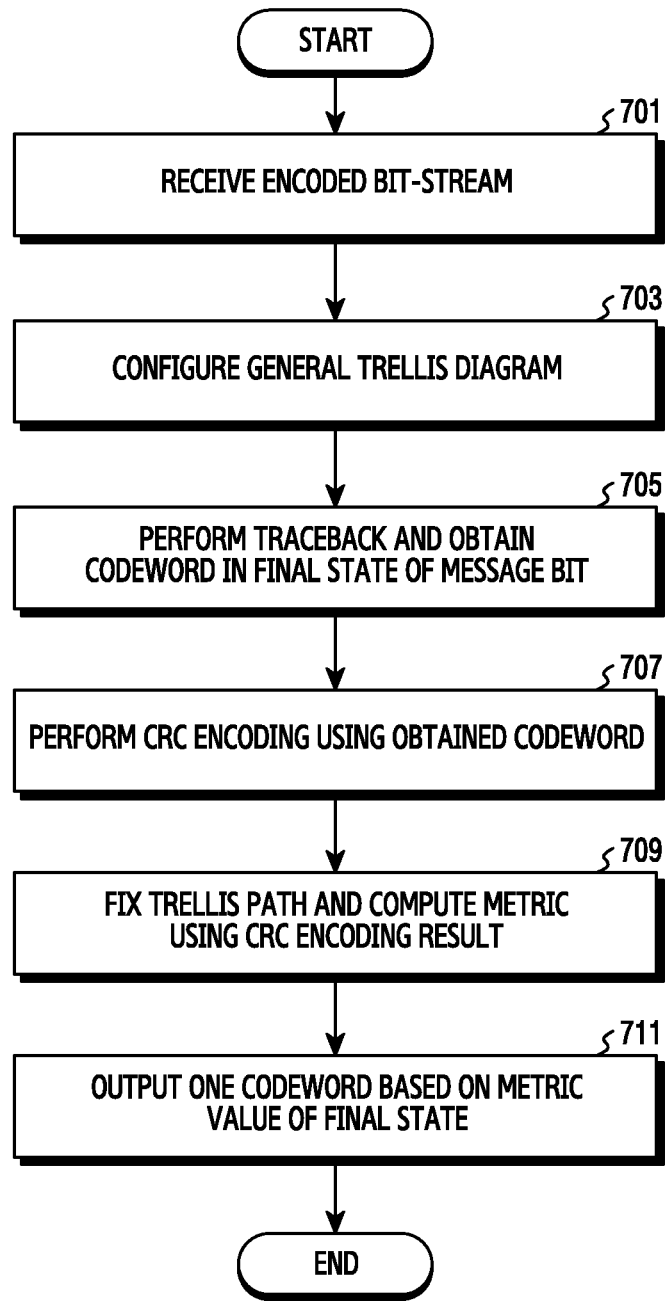
FIG. 7 illustrates a flowchart of a receiving end for fixing a progress path on a trellis diagram by using a CRC bit in a communication system according to various embodiments of the present disclosure.

FIG. 7 illustrates a method of operating the receiving end 120 for decoding a signal in a communication system according to various embodiments of the present disclosure.

Referring to FIG. 7, in step 701, the receiving end receives an encoded bit-stream. That is, the receiving end receives the encoded bit-stream from a transmitting end through a radio channel. According to an embodiment, the encoded bit-stream may be a bit-stream encoded based on concatenated encoding which uses CRC encoding for an outer code and uses TBCC encoding based on a code rate and constraint length determined in a transmitting end for an inner code. Thereafter, the bit-stream subjected to concatenated encoding may be transmitted based on a final code rate. In this case, a finally encoded bit-stream may be determined based on a circular buffer. For example, if a code rate based on the bit-stream subjected to CRC and TBCC concatenated encoding is not matched to the final code rate, the transmitting end transmits a bit-stream matched to the final code rate to the receiving end by performing puncturing on the encoded bit-stream or by adding a parity bit. According to an embodiment, in case of control information such as BCH (broadcast channel), PUCCH (physical uplink control channel), PUSCH (physical shared channel), or the like. In an example, the message bit has 24 bits, and the CRC bit has 16 bits. Therefore, if a code rate of TBCC is ⅓ in a convolution encoder, a bit-stream has 120 bits in total after TBCC encoding, and a final bit-stream is determined based on a final code rate at which transmission is achieved via a receiving end. For example, if a final code rate determined by a circular buffer is ⅓, a total bit-stream transmitted via the transmitting end is 24×3=72, and 48 bits are punctured among all 120 bits subjected to TBCC encoding. For another example, if the final code rate determined by the circular buffer is ⅙, a total bit-stream transmitted via the transmitting end is 24×6=144, and a parity bit of 24 bits are added to all 120 bits subjected to TBCC encoding and thus a bit-stream having 144 bits is transmitted to satisfy a final code rate. In this case, the parity bit may be added to a front portion of the 120 bits subjected to TBCC encoding. However, the present disclosure is not limited thereto, and thus may equally apply to an encoder having message bits, CRC bits, and code rates of various sizes.

In step 703, the receiving end configures a general trellis diagram. That is, the receiving end may receive a bit-stream based on a final code rate from the transmitting end, and may configure the trellis diagram on the basis thereof. Herein, the configuring of the trellis diagram may include computing of a metric value through the received bit-stream. According to an embodiment, the receiving end may configure the general trellis diagram. Herein, the general trellis diagram is a trellis diagram which proceeds from a message bit to a CRC bit, in that order. That is, unlike in the embodiment in which a candidate group of an initial state is estimated in the receiving end through the modified trellis diagram, in case of performing the entire list Viterbi decoding, a trellis diagram based on an correct bit-stream before being subjected to TBCC encoding may be configured in the transmitting end. Regarding a bit-stream received from an initial state for a CRC bit of the trellis diagram until a final state for a message bit, the receiving end computes an ACS for a bit-stream that can be output in each state, and obtains information on a metric value and survivor path for each state. According to an embodiment, an initial state at which the receiving end starts to compute a metric value may be any one initial state among candidate groups of an initial state, obtained through the modified trellis diagram. In this case, before computing a metric to compare a received bit-stream and an output bit-stream in each state, the receiving end computes an ACS by setting a state metric for an initial state of a candidate group to 0 and setting a state metric for the remaining states except for the initial state to infinite, thereby computing metric values.

In step 705, the receiving end performs the traceback in a final state for a message bit to obtain a codeword. The receiving end computes a metric value up to the final state for the message bit, and identifies one state corresponding to a best metric value among a plurality of final states. One state according to an embodiment may be a state having a smallest metric value. The receiving end performs the traceback from the identified final state to obtain a codeword corresponding to survivor paths reaching the final state. For example, when performing the traceback in the final state '100101', the receiving end identifies the survivor path of the state '100101' and obtains a bit of 0 or 1 corresponding to the identified survivor path. The receiving end performs the traceback and identifies a state of a previous stage linked via the survivor path of state '100101'. Herein, the stage represents a flow of time on the trellis diagram. Thereafter, the receiving end may obtain a codeword for all message bits by performing a process of identifying a survivor path and obtaining a bit repeatedly at every stage until the initial state is reached.

In step 707, the receiving end performs CRC encoding by using the obtained codeword. That is, the receiving end obtains a codeword for a message bit through the traceback, and obtains a second CRC bit by performing CRC encoding for the codeword.

In step 709, the receiving end uses a CRC encoding result to compute a metric by fixing a trellis path. That is, the receiving end may use a second CRC bit which is a CRC encoding result to compute a metric value of a trellis diagram section corresponding to a first CRC bit, after a message bit. According to an embodiment, the receiving end may proceed to a trellis path corresponding to the first CRC bit, after the message bit, on the basis of the second CRC bit. That is, the receiving end may skip an ACS operation which computes a metric by comparing a received bit-stream and an output bit-stream for two branches to determine a survivor path by comparing the computed metric. The receiving end computes a metric value by comparing a received bit-stream and an output bit-stream of a fixed trellis path while proceeding to the obtained trellis path corresponding to the second CRC bit.

In step 711, the receiving end outputs one codeword on the basis of a metric value of a final state. The receiving end computes a metric value of a final state by proceeding to the trellis path fixed based on the second CRC bit, and outputs a codeword for a trellis path having a best metric value among a plurality of final states as a final codeword. Since the receiving end proceeds to the trellis path fixed based on the second CRC bit in a trellis section corresponding to the first CRC bit, the obtained codeword may always satisfy CRC checking.

Figure 8:
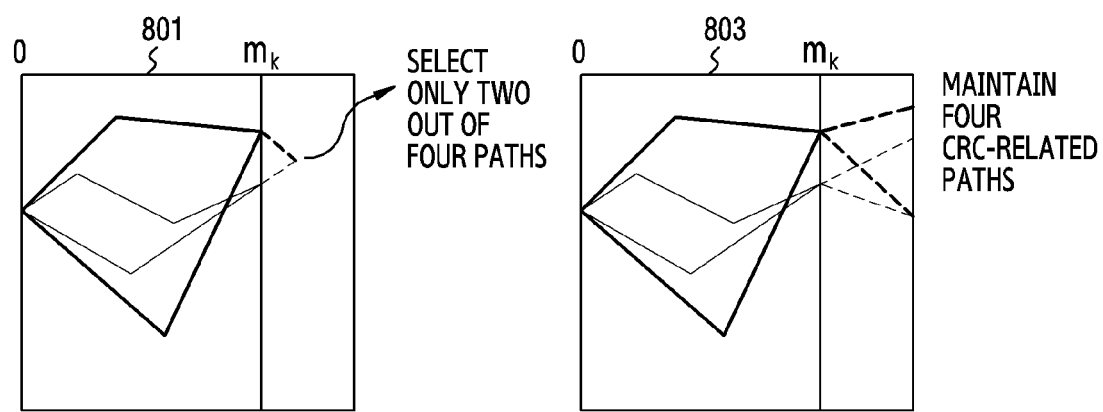
FIG. 8 illustrates a trellis diagram in which a progress path is fixed using a CRC bit in a communication system according to various embodiments of the present disclosure.
Figure 9A:
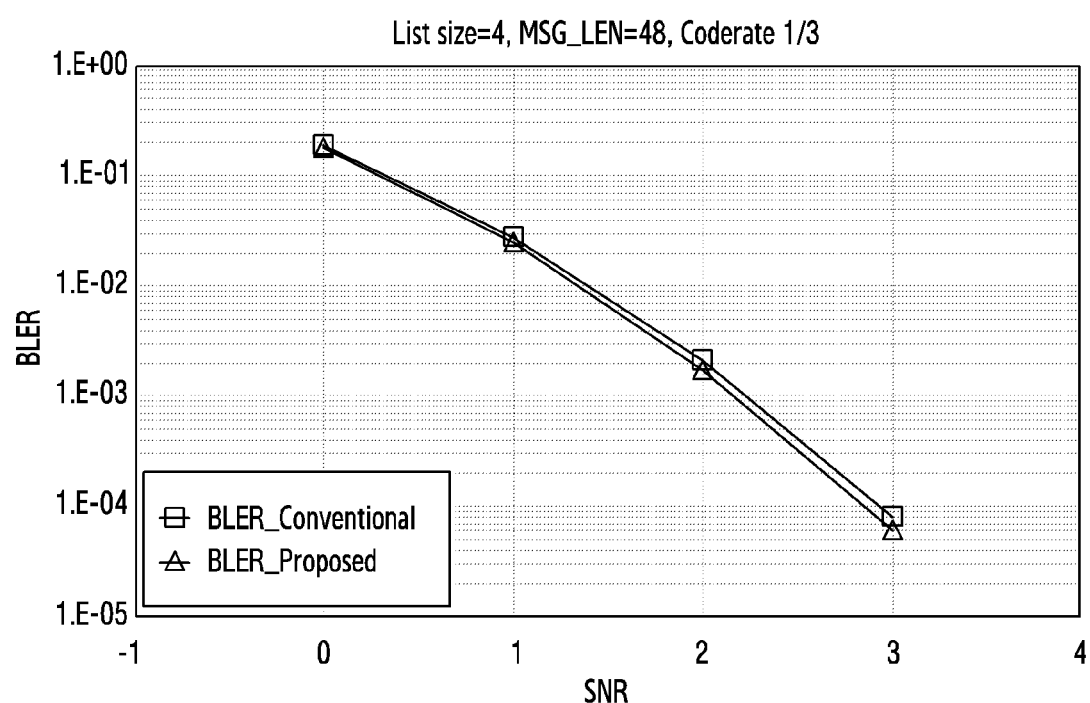
FIG. 9A to FIG. 9J are graphs illustrating performance of Viterbi decoding using a CRC bit in a communication system according to various embodiments of the present disclosure.
Figure 9B:
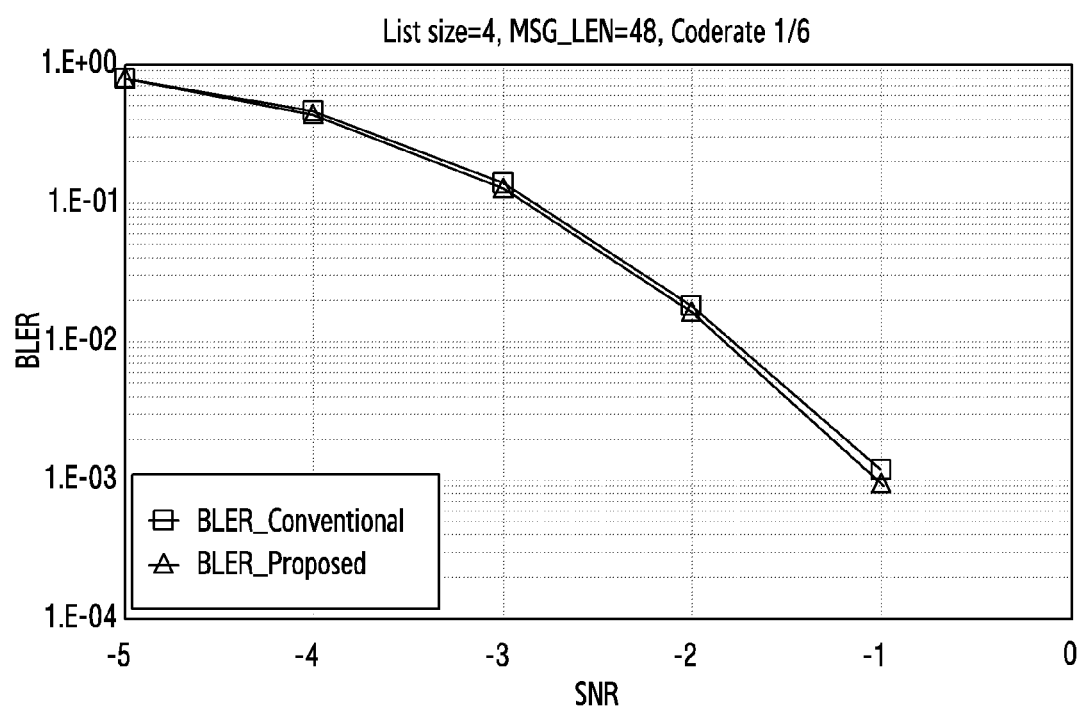
Figure 9C:
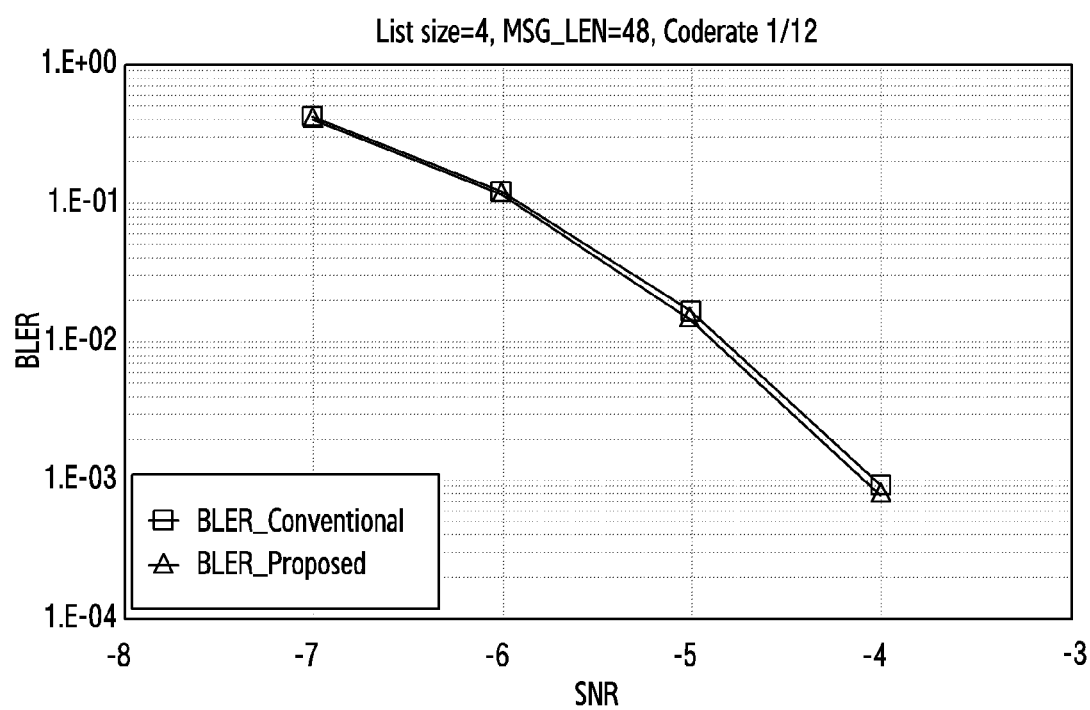
Figure 9D:
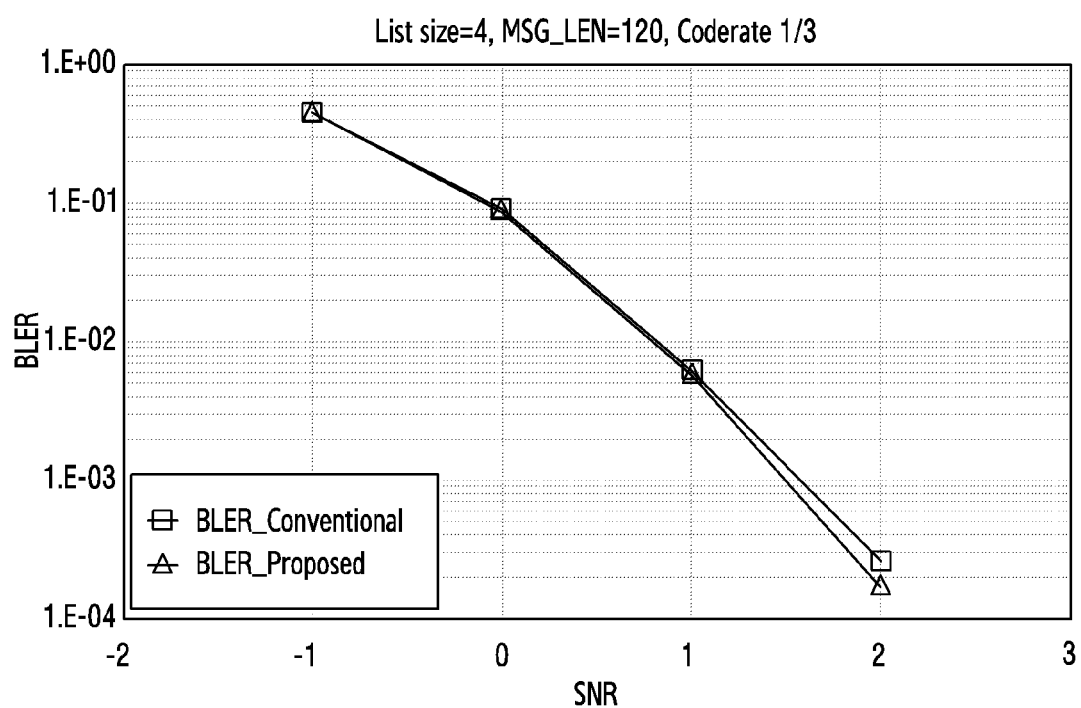
Figure 9E:
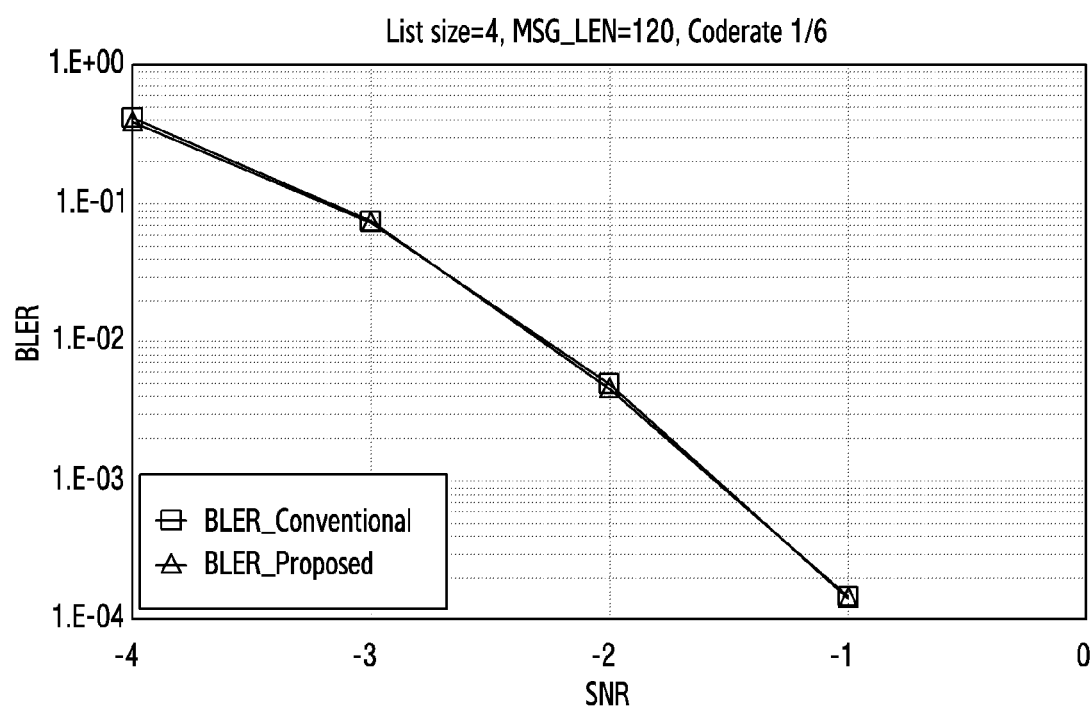
Figure 9F:
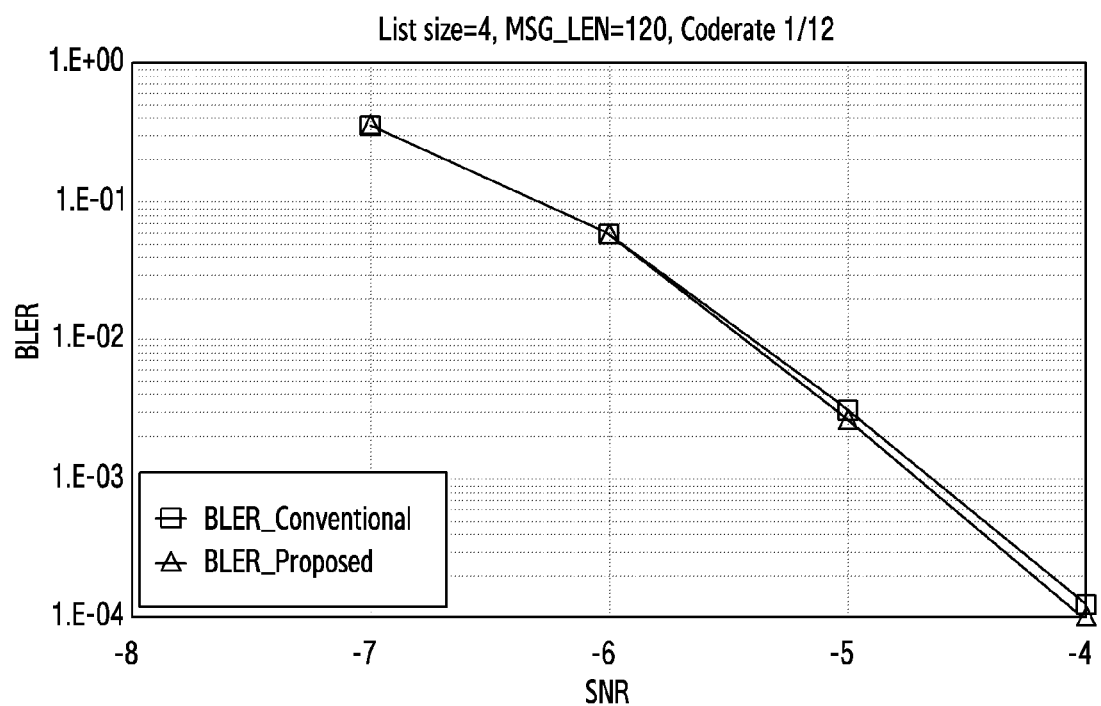
Figure 9G:
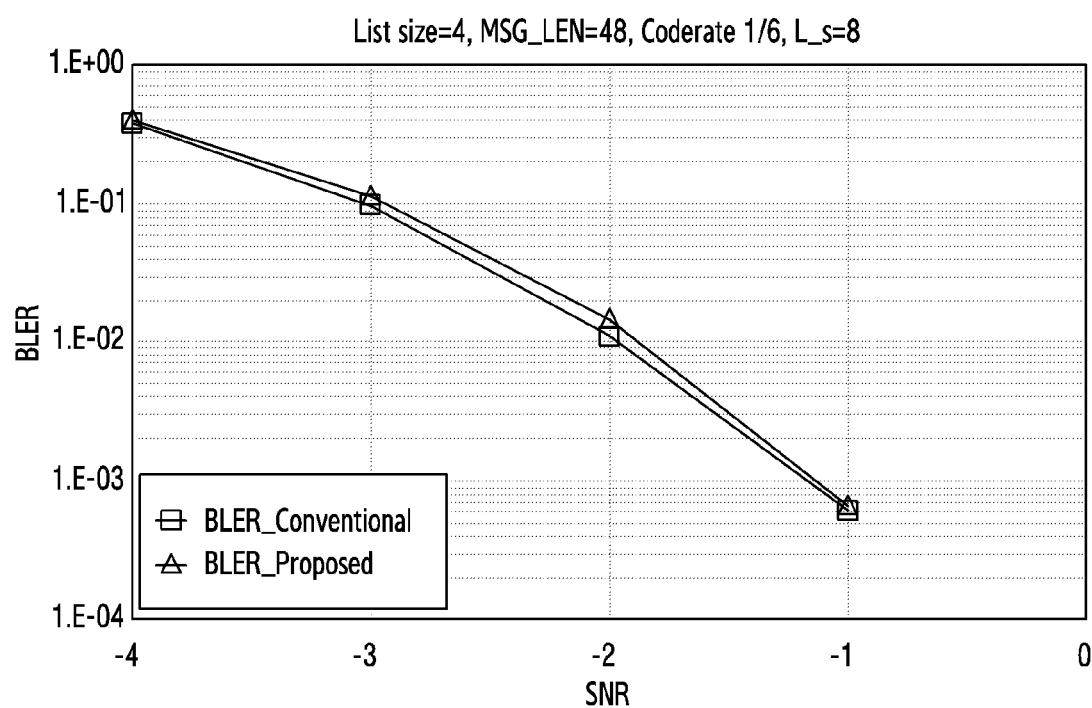
Figure 9H:
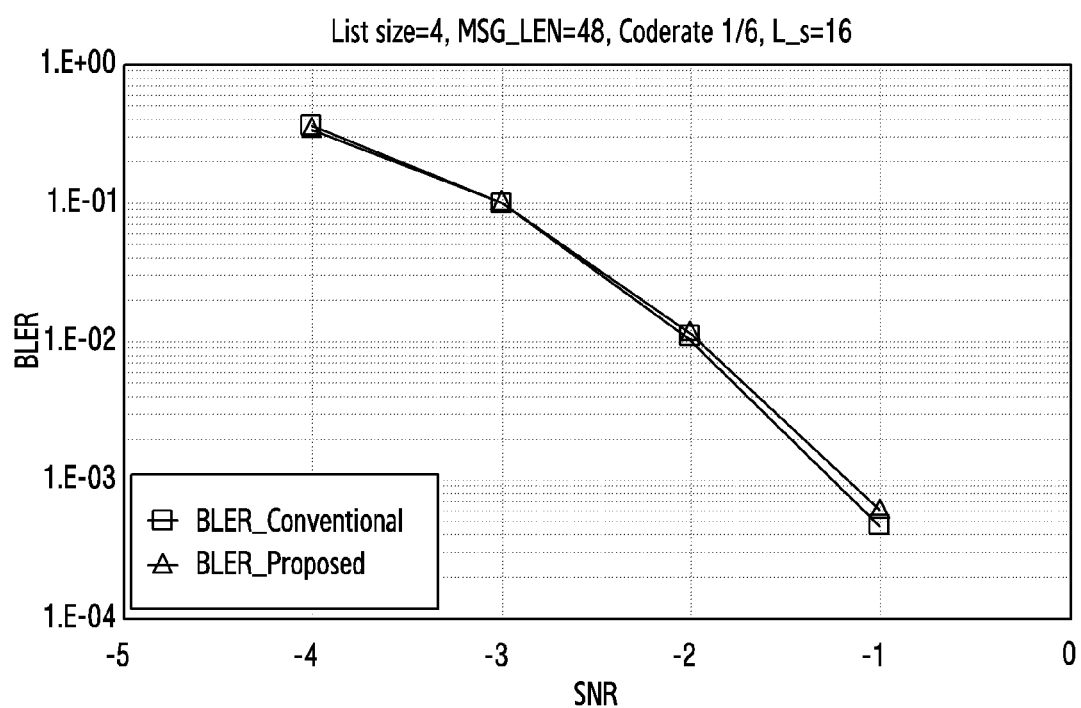
Figure 9I:
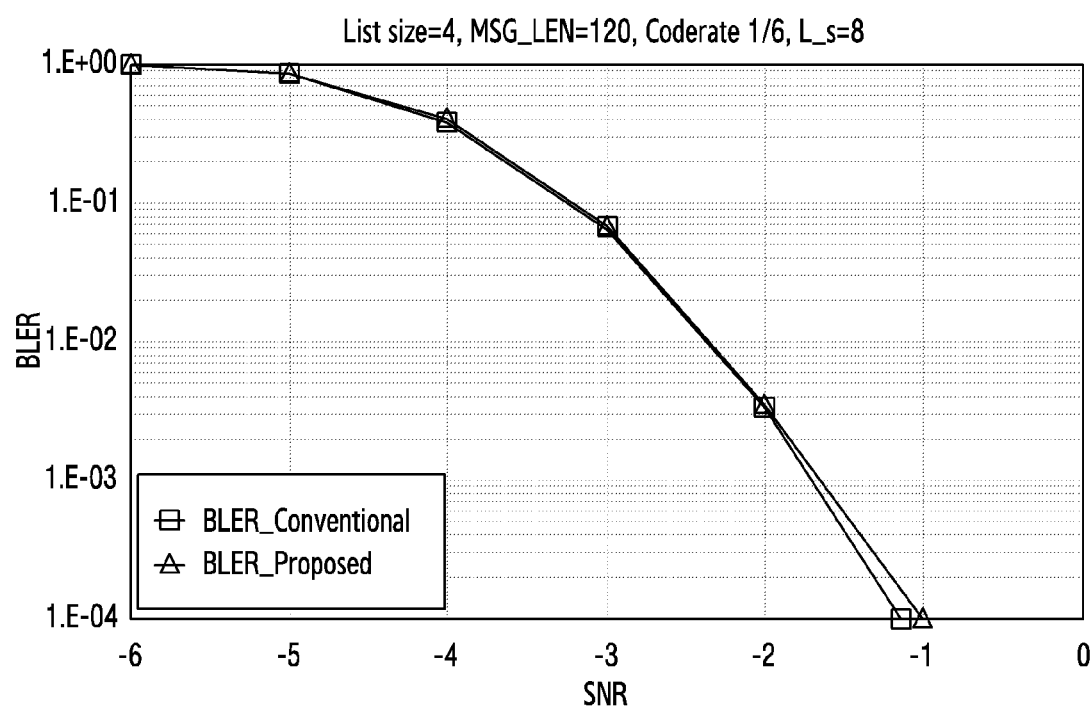
Figure 9J:
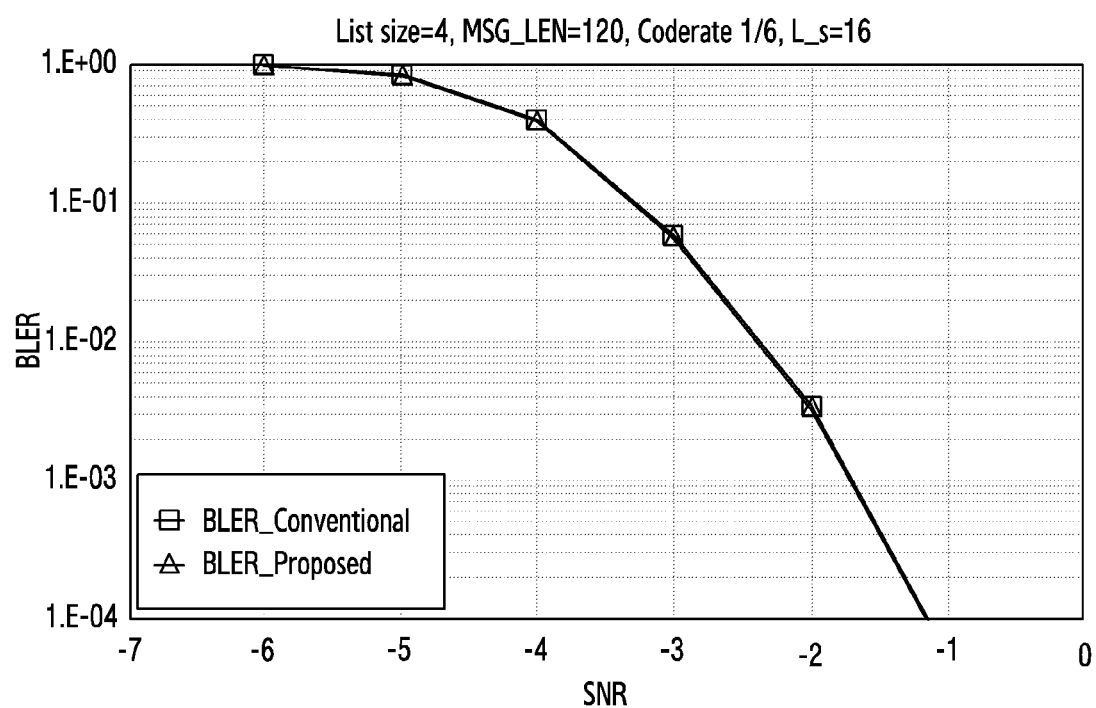

FIG. 8 illustrates a trellis diagram in which a progress path is fixed using a CRC bit in a communication system according to various embodiments of the present disclosure.

Referring to FIG. 8, a diagram 801 illustrates a progress path of a trellis diagram according to the conventional LVA scheme. Herein, a list Viterbi decoding scheme may be a parallel list Viterbi decoding scheme. The parallel list Viterbi decoding scheme selects L paths each proceeding to a next state from a current state in order of having a good metric value. For example, the diagram 801 illustrates a trellis path of a parallel list Viterbi with L=2. In case of the parallel list Viterbi with L=2, a receiving end selects two paths for an initial state and a final state. In the conventional scheme with L=2, the receiving end selects two paths on a metric basis among four incoming paths equally to a previous computation for each state in regards to a stage after a message bit.

A diagram 802 illustrates a progress path fixed on a trellis diagram according to the present disclosure. The receiving end performs the same list Viterbi decoding as the conventional scheme for up to a message bit. Therefore, the number of incoming paths in a final state of the message bit is 4 similarly to the diagram 801. Thereafter, the receiving end computes a metric value, and obtains four codewords through a traceback for each of the four paths while skipping a process of selecting two paths according to a metric value among the 4 paths. The receiving end obtains four second CRC bits different from each other by performing CRC encoding on the obtained code word. Therefore, the receiving end may skip a process of selecting two out of four incoming paths on the basis of a metric value, and may proceed to each of the four paths according to the four second CRC bits different from each other.

According to the aforementioned different embodiments, the receiving end may determine an initial state by using CRC bits, or may fix a trellis path for the CRC bits. Accordingly, computation complexity of decoding is decreased. An operation of the aforementioned various embodiments may be applied to a general Viterbi decoding processor, and may be further applied to a list Viterbi decoding algorithm. The list Viterbi decoding algorithm will be described in brief as follows.

Unlike in zero-tail convolution encoding in which a 0-bit is inserted in accordance with a shift register to initialize an initial state of an encoder to 0, a decoding process of TBCC encoding requires a process of estimating the initial state due to a characteristic of TBCC in which the initial state is determined based on a message. After estimating $L_s$ initial states, $L_c$ codeword candidate groups having a good metric are selected by performing list Viterbi decoding while fixing an initial state and a final state to a corresponding state with respect to each candidate in the initial state. The list Viterbi decoding process is roughly divided into sequential, parallel, and per-stage schemes which respectively select $L_c$ codewords having a best metric value in the entire trellis, $L_c$ codewords having a good metric value in each state, and $L_c$ codewords having a good metric value in each stage. Finally, among $L_sL_c$ candidate groups, $L_f$ codewords having a good metric value are selected as a final list. Next, among codewords satisfying CRC checking in the final list, a codeword having a best metric value is selected as a final output codeword. According to initial state estimation using a CRC bit of the present disclosure, the receiving end may decrease an amount of computation in comparison with the conventional initial state estimation scheme, and may decrease a probability of selecting a trellis path of which an initial state and a final state are not matched simply on the basis of the metric value, and may decrease computation complexity for initial state estimation. In addition, according to Viterbi decoding using the CRC bit of the present disclosure, the receiving end may output a codeword having a best metric among codewords always satisfying CRC checking, without having to perform CRC checking.

FIG. 9A to FIG. 9J are graphs illustrating performance of Viterbi decoding using a CRC bit in a communication system according to various embodiments of the present disclosure. Hereinafter, a horizontal axis represents a Signal-to-Noise Ratio (SNR), and a vertical axis represents a Block Error Rate (BLER) in the graphs of FIG. 9A to FIG. 9J. Hereinafter, in the graphs of FIGS. 9A to 9J, the horizontal axis represents a signal-to-noise ratio (SNR) and the vertical axis represents a block error rate (BLER).

FIG. 9A to FIG. 9J are graphs for comparing final Block Error Rate (BLER) performance by applying list Viterbi decoding in an initial state estimation scheme using a CRC bit and an initial state estimation scheme proposed in the conventional technique. The initial state estimation scheme proposed in the conventional technique is achieved by repeating a Viterbi algorithm three times. Therefore, in comparison with the initial state estimation scheme using the CRC bit according to the present disclosure, the initial state estimation scheme proposed in the conventional technique additionally performs the Viterbi algorithm one time. The initial state estimation scheme using the CRC bit according to the present disclosure additionally performs CRC encoding in comparison with the initial state estimation scheme proposed in the conventional technique. However, since the CRC encoding is an operation based on hard decision whereas the Viterbi algorithm is an operation based on soft decision, the initial state estimation scheme using the CRC bit according to the present disclosure has lower computation complexity.

Hereinafter, FIG. 9A to FIG. 9F illustrate a result of comparing the initial state estimation scheme proposed in the conventional technique and the initial state estimation scheme according to the present disclosure at BPSK, $L_s$=4, $L_c$=4, $L_f$=16, L=4. In FIG. 9A to FIG. 9F, the initial state estimation scheme using a CRC bit has lower computation complexity than the initial state estimation scheme proposed in the conventional technique while having similar or slightly improved performance for all sections.

Hereinafter, FIG. 9A to FIG. 9J illustrate graphs based on an initial state estimation scheme when $L_s$ is set to a value greater than 4. When $L_s$ is set to the value greater than 4, the initial state estimation scheme using the CRC bit has lower performance than the initial state estimation scheme proposed in the conventional technique. There is a performance difference when many candidate groups of an initial state are selected since the candidate group of the initial state is selected by using a metric value obtained by repeating a Viterbi algorithm three times, whereas a metric value obtained by repeating the Viterbi algorithm two times and by using an operation corresponding to CRC 16 bits is used in case of the initial state estimation scheme using the CRC bit according to the present disclosure. That is, this is because an initial state of a level of a metric based on the scheme proposed in the conventional technique is not estimated to the extent that the Viterbi algorithm is less performed.

FIG. 10A to FIG. 10G are performance graphs illustrating Viterbi decoding using a CRC bit in a communication system according to various embodiments of the present disclosure. Hereinafter, a horizontal axis represents a Signal-to-Noise Ratio (SNR), and a vertical axis represents a Block Error Rate (BLER) in the graph of FIG. 10A to FIG. 10G. In the graphs of FIGS. 10A to 10G, the horizontal axis represents a signal-to-noise ratio (SNR) and the vertical axis represents a block error rate (BLER).

Figure 10A:
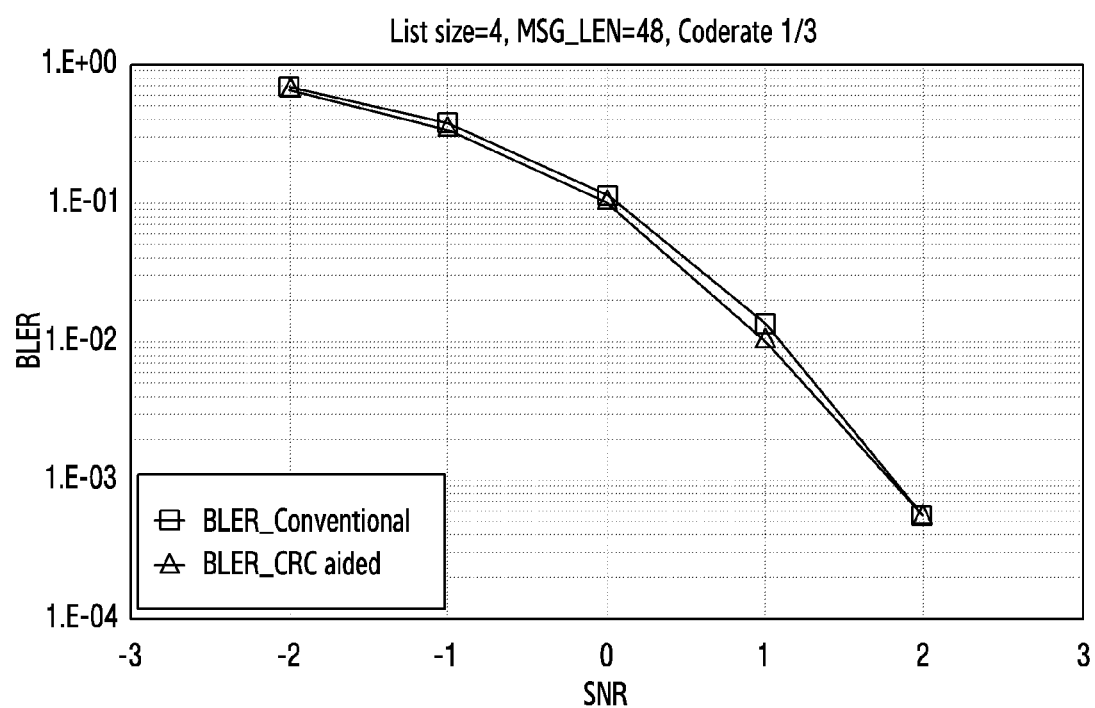
FIG. 10A to FIG. 10G are performance graphs illustrating Viterbi decoding using a CRC bit in a communication system according to various embodiments of the present disclosure.
Figure 10B:
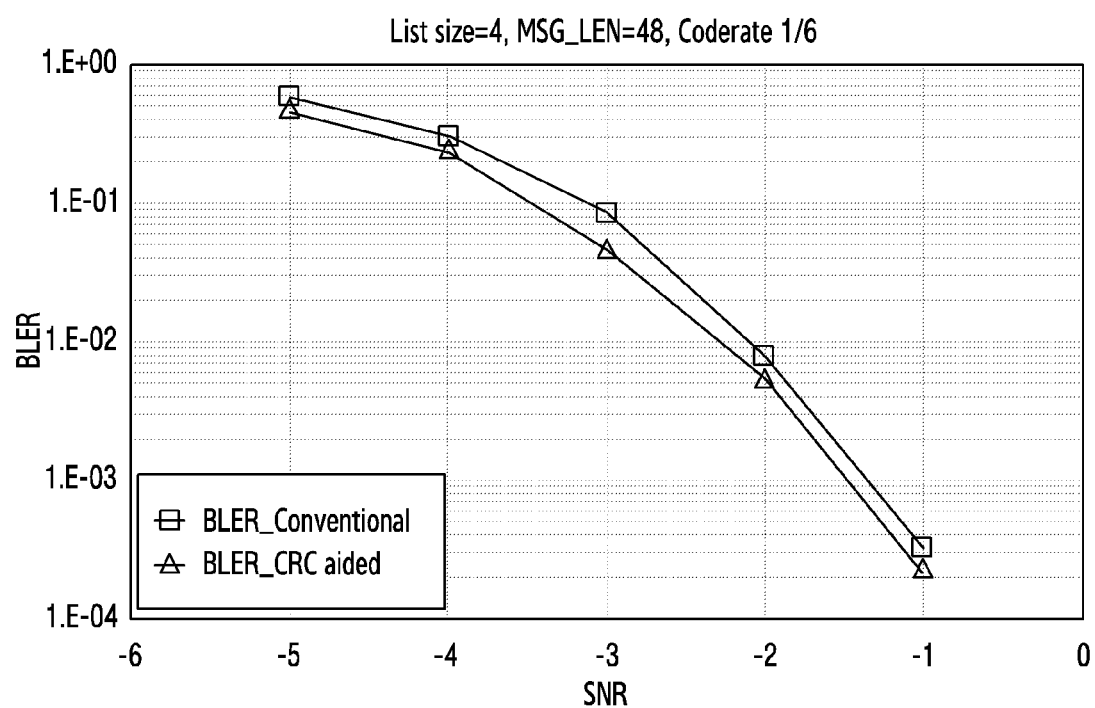
Figure 10C:
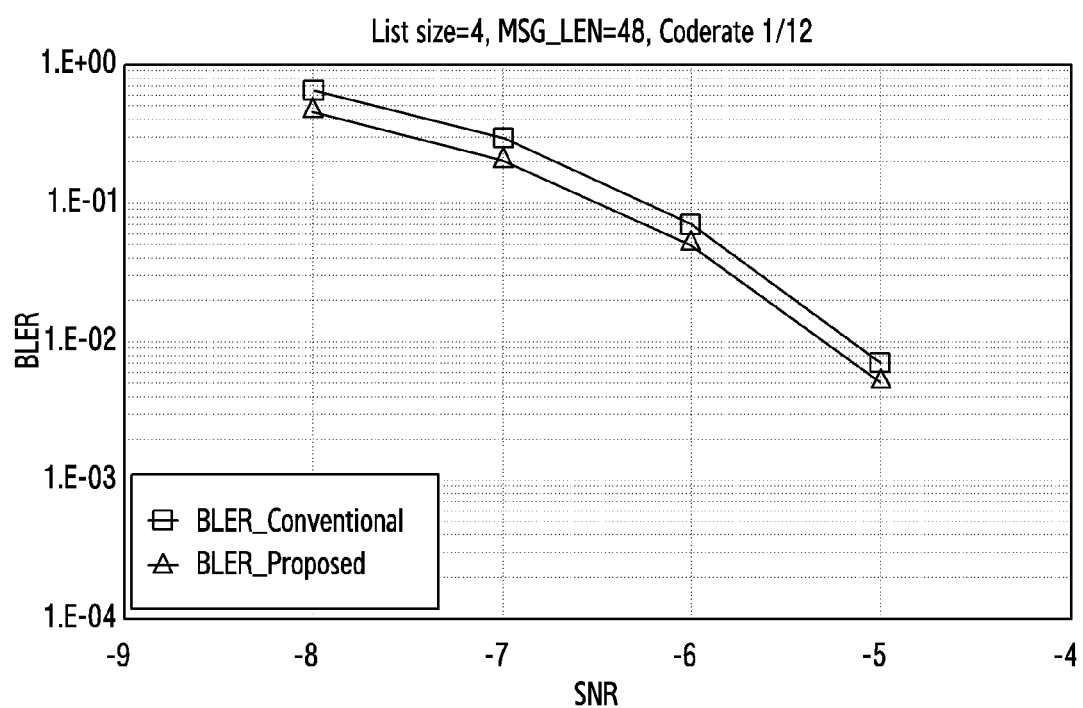
Figure 10D:
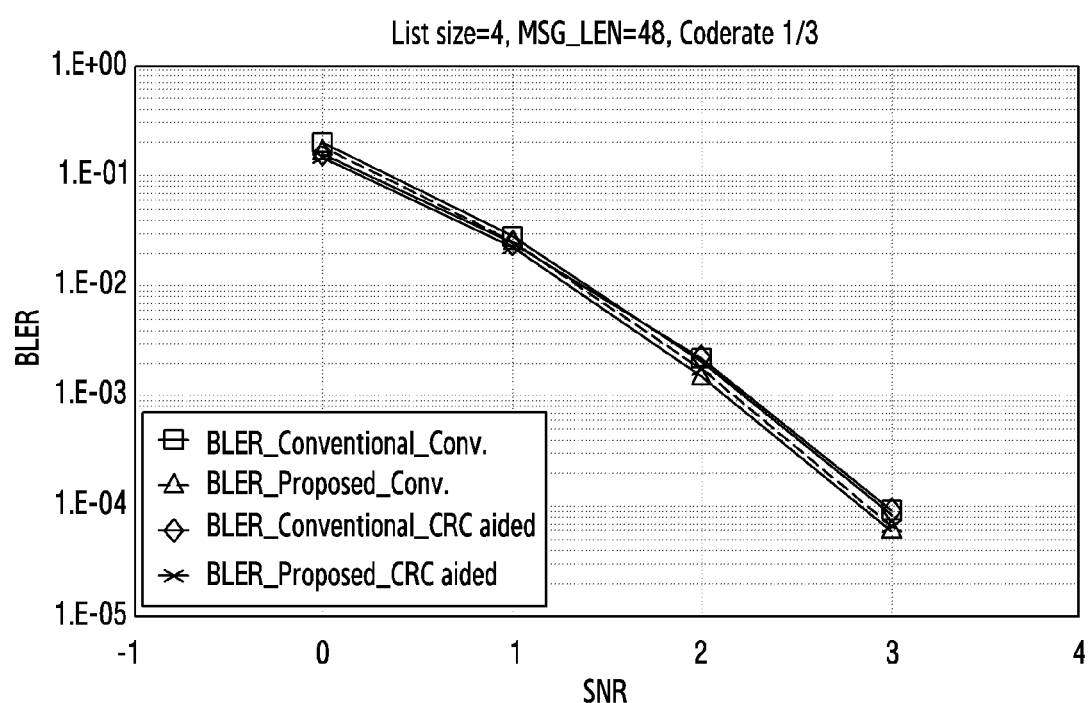
Figure 10E:
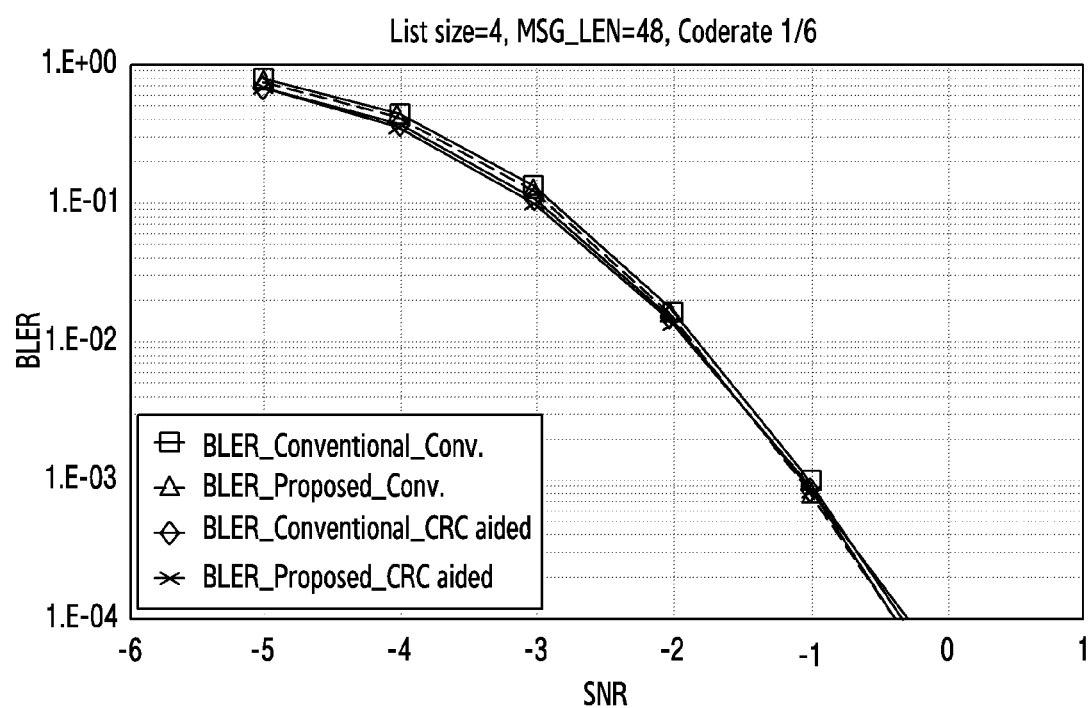
Figure 10F:
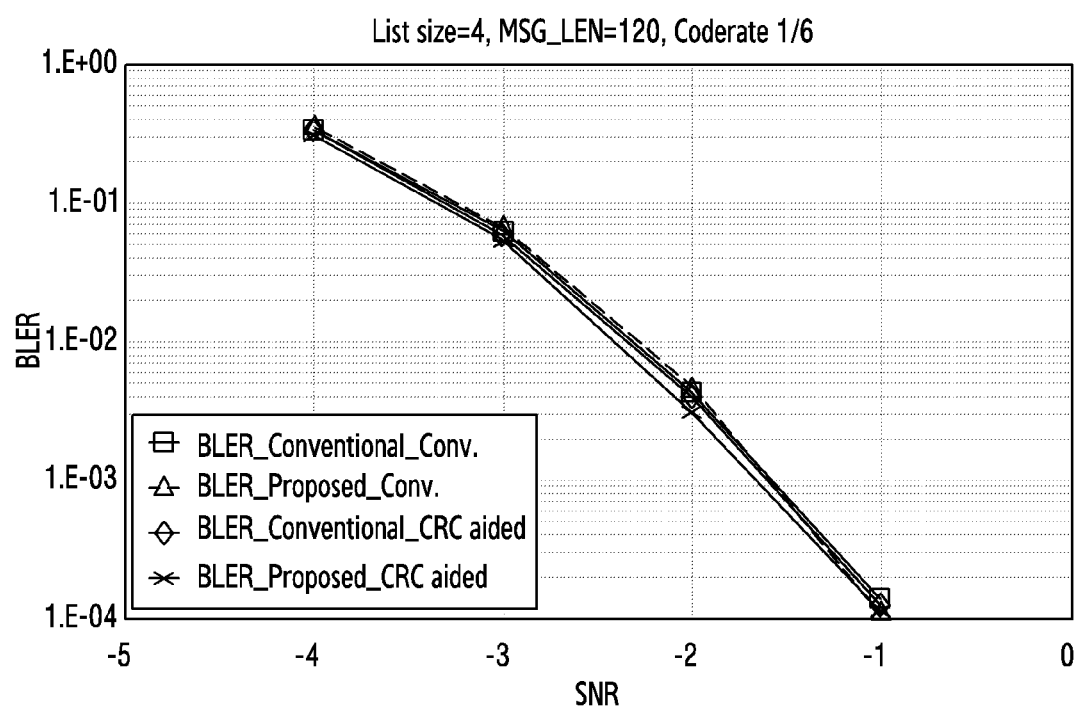
Figure 10G:
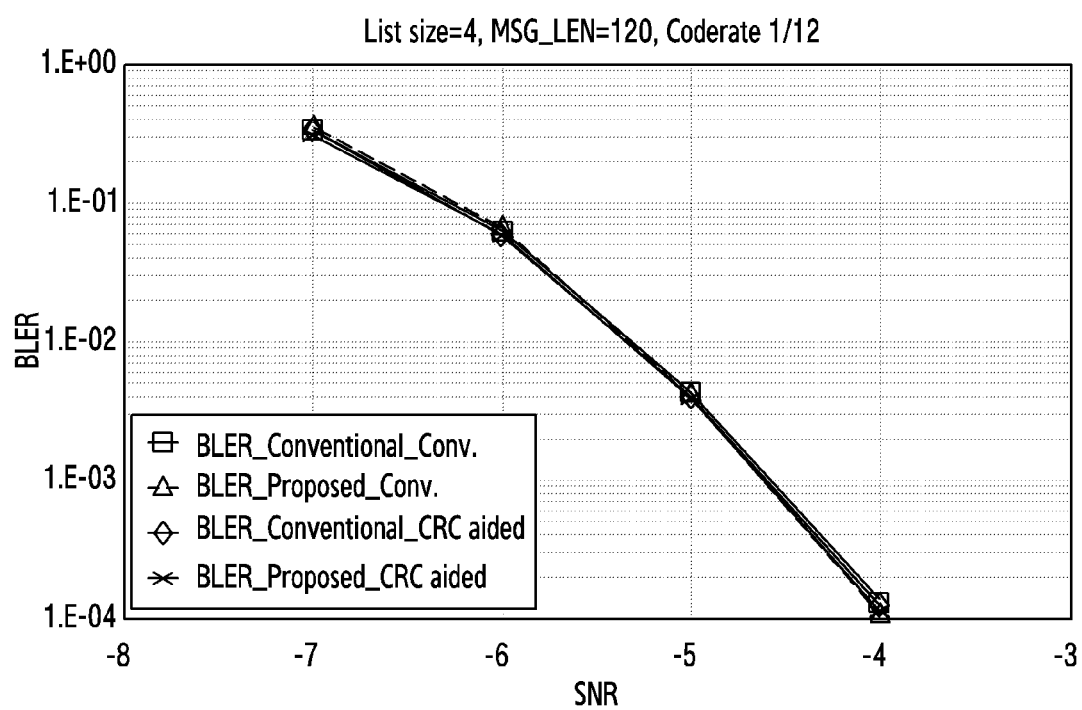

Hereinafter, in the graph of FIG. 10A to FIG. 10, performance is compared at $L_c=4$, $L_f=256$ in case of the conventional scheme for L=4 when $L_s=64$ and at $L_c=1$, $L_f=1$ in case of the proposed scheme. Both of the two cases use a BPSK modulation scheme. Although Viterbi decoding using a CRC bit has lower computation complexity, it can be seen that better or similar performance is exhibited in the entire section. This shows that the proposed scheme using a CRC structure is effective.

Hereinafter, FIG. 10D to FIG. 10G illustrate performance graphs at $L_s=4$, $L_c=4$, L=4. It can be seen in FIG. 10D to FIG. 10G that an initial state is estimated by using a CRC bit, and a decoding scheme according to the present disclosure shows lowest computation complexity and best performance when a fixed trellis path proceeds by using the CRC bit in Viterbi decoding.

Methods based on the embodiments disclosed in the claims and/or specification of the present disclosure can be implemented in hardware, software, or a combination of both.

When implemented in software, computer readable recording medium for storing one or more programs (i.e., software modules) can be provided. The one or more programs stored in the computer readable recording medium are configured for execution performed by one or more processors in the electronic device. The one or more programs include instructions for allowing the electronic device to execute the methods based on the embodiments disclosed in the claims and/or specification of the present disclosure.

The program (i.e., the software module or software) can be stored in a random access memory, a non-volatile memory including a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs) or other forms of optical storage devices, and a magnetic cassette. Alternatively, the program can be stored in a memory configured in combination of all or some of these storage media. In addition, the configured memory can be plural in number.

Further, the program can be stored in an attachable storage device capable of accessing the electronic device through a communication network such as the Internet, an Intranet, a Local Area Network (LAN), a Wide LAN (WLAN), or a Storage Area Network (SAN) or a communication network configured by combining the networks. The storage device can have an access to a device for performing an embodiment of the present disclosure via an external port. In addition, an additional storage device on a communication network can have an access to the device for performing the embodiment of the present disclosure.

In the aforementioned specific embodiments of the present disclosure, a constitutional element included in the disclosure is expressed in a singular or plural form according to the specific example embodiment proposed herein. However, the singular or plural expression is selected properly for a situation proposed for the convenience of explanation, and thus the various embodiments of the present disclosure are not limited to a single or a plurality of constitutional elements. Therefore, a constitutional element expressed in a plural form can also be expressed in a singular form, or vice versa.

While the present disclosure has been shown and described with reference to certain preferred embodiments thereof, it will be understood by those skilled in the art that various changes in form and details may be made therein without departing from the spirit and scope of the present disclosure as defined by the appended claims. Therefore, the scope of the present disclosure is defined not by the detailed description thereof but by the appended claims, and all differences within equivalents of the scope will be construed as being included in the present disclosure.

What is claimed is:

1. A method of decoding a signal in a communication system, the method comprising:
    receiving an encoded bit-stream corresponding to message bits and first Cyclic Redundancy Check (CRC) bits;
    obtaining a codeword through a traceback for at least part of the encoded bit-stream;
    obtaining second CRC bits by performing CRC encoding on the codeword; and
    performing a decoding based on at least part of the second CRC bits,
    wherein the performing of the decoding based on the at least part of the second CRC bits comprises proceeding to a path on a trellis diagram based on the second CRC bits.

2. The method of claim 1, wherein the performing of the decoding based on at least part of the second CRC bits comprises:
    determining whether initial states of the at least part of the second CRC bits and the message bits are identical to each other;
    adding the initial state to an initial state candidate group of a List Viterbi Algorithm (LVA) if the initial states of the at least part of the second CRC bits and the message bits are identical to each other; and
    performing the LVA on the initial state candidate group.

3. The method of claim 2, wherein the obtaining of the codeword comprises:
    configuring a modified trellis diagram;
    computing a matrix value;
    identifying a final state having a best metric among a plurality of final states of the message bits; and
    performing a traceback in the final state having the best metric,
    wherein the modified trellis diagram proceeds from the first CRC bits to the message bits.

4. The method of claim 2, wherein the determining of whether the at least part of the second CRC bits and the initial states of the message bits are identical to each other comprises:
    identifying a number of bits constituting the obtained codeword;
    identifying last bits among the second CRC bits when a number of last bits is identical to the identified number; and
    determining whether the last bits are identical to initial-state bits of the message bits.

5. The method of claim 3, wherein the identifying of the final state having the best metric among the plurality of final states of the message bits comprises identifying a final state having a second best metric among the plurality of final states if the initial states of the at least part of the second CRC bits and the message bits are not identical to each other.

6. The method of claim 5, further comprising:
    computing a metric value for additional CRC bits if a number of candidate groups is less than a pre-set random number;
    identifying at least one final state based on the metric value among the final states of the additional CRC bits; and adding the identified at least one final state to the initial state candidate group.

7. The method of claim 1, wherein the proceeding to the path on the trellis diagram based on the second CRC bits comprises:
   identifying a path proceeding to a next state based on the second CRC bits; and
   computing a metric value based on a bit-stream to be output and received based on the path.

8. The method of claim 1, wherein the trellis diagram is a trellis diagram proceeding to the first CRC bits from the message bits.

9. The method of claim 7, further comprising:
   identifying at least one final state having a best metric value among final states of the trellis diagram; and
   outputting a codeword of a trellis path corresponding to the one final state.

10. An apparatus for decoding a signal in a communication system, the apparatus comprising:
    at least one transceiver; and
    at least one processor operatively coupled to the at least one transceiver,
    wherein the at least one processor configured to:
       receive an encoded bit-stream corresponding to message bits and first Cyclic Redundancy Check (CRC) bits;
       obtain a codeword through a traceback for at least part of the encoded bit-stream;
       obtain second CRC bits by performing CRC encoding on the codeword; and
       perform decoding based on at least part of the second CRC bits, and
    wherein the at least one processor is, to perform the decoding, configured to proceed to a path on a trellis diagram based on the second CRC bits.

11. The apparatus of claim 10, wherein the at least one processor is, to perform the decoding, configured to:
    determine whether initial states of the at least part of the second CRC bits and the message bits are identical to each other;
    add the initial state to an initial state candidate group of a List Viterbi Algorithm (LVA) if the initial states of the at least part of the second CRC bits and the message bits are identical to each other; and
    perform the LVA on the initial state candidate group.

12. The apparatus of claim 11, wherein the at least one processor is, to obtain the codeword, configured to:
    configure a modified trellis diagram;
    computing a matrix value;
    identify a final state having a best metric among a plurality of final states of the message bits; and
    perform a traceback in the final state having the best metric, wherein the modified trellis diagram proceeds from the first CRC bits to the message bits.

13. The apparatus of claim 11, wherein the at least one processor is, to determine whether initial states of the at least part of the second CRC bits and the message bits are identical to each other codeword, configured to:
    identify a number of bits constituting the obtained codeword;
    identify last bits among the second CRC bits when a number of last bits is identical to the identified number; and
    determine whether the last bits are identical to initial-state bits of the message bits.

14. The apparatus of claim 12, wherein the at least one processor is, to identify the final state having the best metric among the plurality of final states of the message bits, configured to:
    identify a final state having a second best metric among the plurality of final states if the initial states of the at least part of the second CRC bits and the message bits are not identical to each other.

15. The apparatus of claim 14, wherein the at least one processor is further configured to:
    compute a metric value for additional CRC bits if a number of candidate groups is less than a pre-set random number;
    identify at least one final state based on the metric value among the final states of the additional CRC bits; and
    add the identified at least one final state to the initial state candidate group.

16. The apparatus of claim 10, wherein the at least one processor is, to proceed to the path on the trellis diagram, configured to:
    identify a path proceeding to a next state based on the second CRC bits; and
    compute a metric value based on a bit-stream to be output and received based on the path.

17. The apparatus of claim 16, wherein the at least one processor is further configured to:
    identify at least one final state having a best metric value among final states of the trellis diagram; and
    output a codeword of a trellis path corresponding to the one final state.

18. The apparatus of claim 10, wherein the trellis diagram is a trellis diagram proceeding to the first CRC bits from the message bits.

* * * * *